(12) United States Patent
Kim et al.

(10) Patent No.: US 9,753,368 B2
(45) Date of Patent: Sep. 5, 2017

(54) PHOTOSENSITIVE RESIN COMPOSITION, PHOTOSENSITIVE RESIN FILM USING THE SAME AND COLOR FILTER

(71) Applicant: SAMSUNG SDI CO., LTD., Yongin-si, Gyeonggi-do (KR)

(72) Inventors: Sohyun Kim, Suwon-si (KR); Jaeyoung Kwon, Suwon-si (KR); Sundae Kim, Suwon-si (KR); Jieun Kim, Suwon-si (KR); Kwangwon Seo, Suwon-si (KR); Seungjib Choi, Suwon-si (KR); Eunjeong Choi, Suwon-si (KR); Gyuseok Han, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/270,044

(22) Filed: Sep. 20, 2016

(65) Prior Publication Data
US 2017/0108773 A1    Apr. 20, 2017

(30) Foreign Application Priority Data
Oct. 14, 2015    (KR) .......................... 10-2015-0143593

(51) Int. Cl.
| | |
|---|---|
| G02B 5/23 | (2006.01) |
| G03F 7/004 | (2006.01) |
| G03F 7/031 | (2006.01) |
| G03F 7/033 | (2006.01) |
| G03F 7/16 | (2006.01) |
| G03F 7/20 | (2006.01) |
| G03F 7/26 | (2006.01) |
| G03F 7/40 | (2006.01) |
| C09B 55/00 | (2006.01) |
| G02F 1/1335 | (2006.01) |
| G03F 1/00 | (2012.01) |
| C09B 67/50 | (2006.01) |

(52) U.S. Cl.
CPC .......... *G03F 7/0045* (2013.01); *C09B 55/009* (2013.01); *G03F 7/0048* (2013.01); *G03F 7/031* (2013.01); *G03F 7/033* (2013.01); *G03F 7/16* (2013.01); *G03F 7/20* (2013.01); *G03F 7/26* (2013.01); *G03F 7/40* (2013.01)

(58) Field of Classification Search
USPC ....... 252/586; 349/106; 430/7, 270.1, 281.1, 430/321
See application file for complete search history.

(56) References Cited

U.S. PATENT DOCUMENTS 5,097,034 A    3/1992    Eckstein

FOREIGN PATENT DOCUMENTS

| | | | |
|---|---|---|---|
| EP | 0 564 930 B1 | 2/1997 | |
| JP | 2013-129706 A | 7/2013 | |
| JP | 2013-148889 A | 8/2013 | |
| JP | 5442004 B2 | 3/2014 | |
| JP | 5549350 B2 | 7/2014 | |
| JP | 2014-196394 A | 10/2014 | |
| JP | 2015-028121 A | 2/2015 | |
| JP | 2015-083652 A | 4/2015 | |
| JP | 2015-096598 * | 5/2015 | ............. C09B 69/02 |
| JP | 2015-096598 A | 5/2015 | |
| KR | 10-2014-0013967 A | 2/2014 | |
| KR | 1020140013967 * | 2/2014 | ............. C09B 67/22 |
| KR | 10-2015-0005139 A | 1/2015 | |
| TW | 201522522 A | 6/2015 | |

OTHER PUBLICATIONS

Notice of Allowance/Search report dated Jun. 7, 2017 of the corresponding Taiwanese Patent Application No. 105131486.

* cited by examiner

*Primary Examiner* — Bijan Ahvazi
(74) *Attorney, Agent, or Firm* — Lee & Morse, P.C.

(57) ABSTRACT

A photosensitive resin composition, a photosensitive resin film, and a color filter, the composition including a binder resin; a dye consisting of a cation and an anion; a photopolymerizable compound; a photopolymerization initiator, and a solvent, wherein the dye is included in an amount of about 15 wt % to about 40 wt % based on a total weight of a photosensitive resin composition, and wherein the cation is represented by Chemical Formula 1:

[Chemical Formula 1]

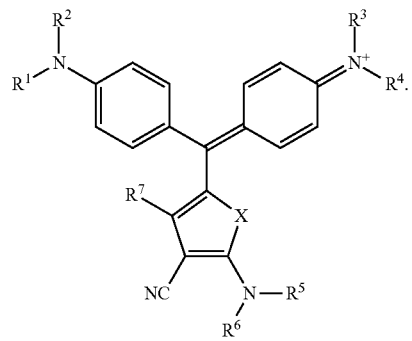

18 Claims, No Drawings

PHOTOSENSITIVE RESIN COMPOSITION, PHOTOSENSITIVE RESIN FILM USING THE SAME AND COLOR FILTER

CROSS-REFERENCE TO RELATED APPLICATION

Korean Patent Application No. 10-2015-0143593, filed on Oct. 14, 2015, in the Korean Intellectual Property Office, and entitled: "Photosensitive Resin Composition, Photosensitive Resin Film Using the Same and Color Filter," is incorporated by reference herein in its entirety.

BACKGROUND

1. Field

Embodiments relate to a photosensitive resin composition, a photosensitive resin film using the same, and a color filter.

2. Description of the Related Art

A pigment having uniformly-sized particles may be prepared by treating the pigment through a process such as salt milling and the like after the synthesis in order to facilitate the stable dispersion state and refinement of pigment dispersion liquid.

SUMMARY

Embodiments are directed to a photosensitive resin composition, a photosensitive resin film using the same, and a color filter.

The embodiments may be realized by providing a photosensitive resin composition including a binder resin; a dye consisting of a cation and an anion; a photopolymerizable compound; a photopolymerization initiator, and a solvent, wherein the dye is included in an amount of about 15 wt % to about 40 wt % based on a total weight of a photosensitive resin composition, wherein the cation is represented by Chemical Formula 1:

[Chemical Formula 1]

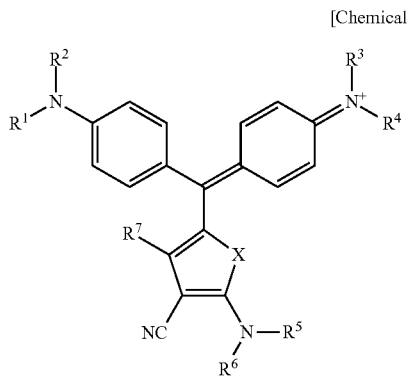

wherein, in Chemical Formula 1, $R^1$ to $R^6$ are each independently a hydrogen atom, a substituted or unsubstituted C1 to C20 alkyl group, a substituted or unsubstituted C6 to C20 aryl group, or a substituted or unsubstituted C2 to C20 heteroaryl group, $R^7$ is a substituted or unsubstituted C6 to C20 aryl group, and X is —O—, —S—, or —$NR^8$—, in which $R^8$ is a hydrogen atom, a substituted or unsubstituted C1 to C10 alkyl group or a substituted or unsubstituted C6 to C20 aryl group.

X may be —O— or —S—.

$R^1$ to $R^4$ may each independently be a substituted or unsubstituted C1 to C20 alkyl group or a substituted or unsubstituted C6 to C20 aryl group.

The cation represented by Chemical Formula 1 may be represented by Chemical Formula 2:

[Chemical Formula 2]

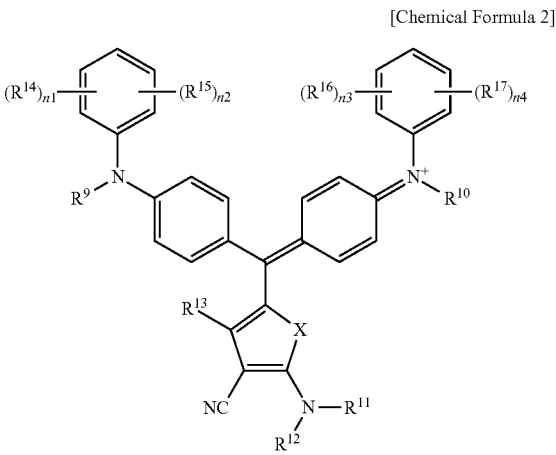

wherein, in Chemical Formula 2, $R^9$ and $R^{10}$ are each independently a substituted or unsubstituted C1 to C20 alkyl group, $R^{11}$ and $R^{12}$ are each independently a hydrogen atom, a substituted or unsubstituted C1 to C20 alkyl group, or a substituted or unsubstituted C6 to C20 aryl group, $R^{13}$ is a substituted or unsubstituted C6 to C20 aryl group, $R^{14}$ to $R^{17}$ are each independently a halogen atom or a substituted or unsubstituted C1 to C10 alkyl group, n1 to n4 are each independently an integer of 0 to 5, such that $0 \leq n1+n2 \leq 5$, and $0 \leq n3 \leq n4 \leq 5$, and X is —O— or —S—.

The cation represented by Formula 1 may be represented by one of the following Chemical Formula 3 to Chemical Formula 7:

[Chemical Formula 3]

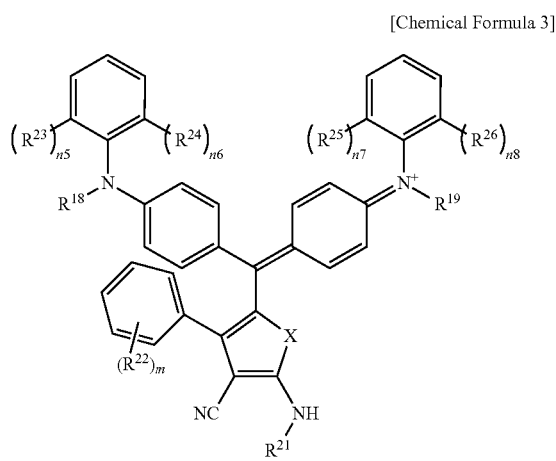

wherein, in Chemical Formula 3, $R^{18}$, $R^{19}$, and $R^{21}$ are each independently a substituted or unsubstituted C1 to C20 alkyl group, $R^{22}$ is a halogen atom, $R^{23}$ to $R^{26}$ are each independently a halogen atom or a substituted or unsubstituted C1 to C 10 alkyl group, m is an integer of 0 to 2, n5 to n8 are each independently 0 or 1, and X is —O— or —S—,

[Chemical Formula 4]

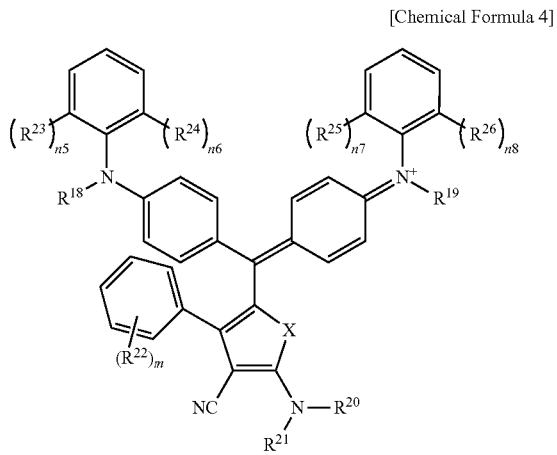

wherein, in Chemical Formula 4, $R^{18}$ to $R^{21}$ are each independently a substituted or unsubstituted C1 to C20 alkyl group, $R^{22}$ is a halogen atom, $R^{23}$ to $R^{26}$ are each independently a halogen atom or a substituted or unsubstituted C1 to C10 alkyl group, m is an integer of 0 to 2, n5 to n8 are each independently 0 or 1, and X is —O— or —S—,

[Chemical Formula 5]

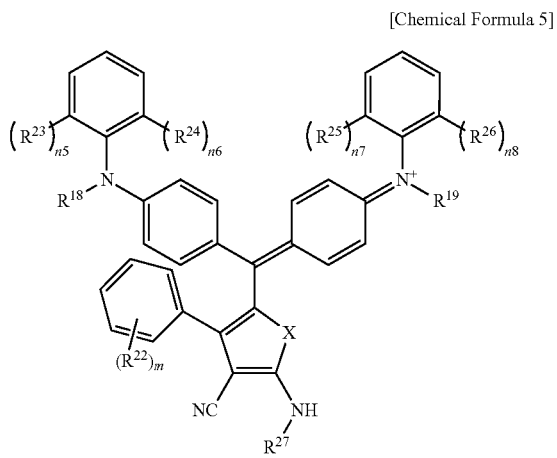

wherein, in Chemical Formula 5, $R^{18}$ and $R^{19}$ are each independently a substituted or unsubstituted C1 to C20 alkyl group, $R^{22}$ is a halogen atom, $R^{23}$ to $R^{26}$ are each independently a halogen atom or a substituted or unsubstituted C1 to C10 alkyl group, $R^{27}$ is a substituted or unsubstituted C6 to C20 aryl group, m is an integer of 0 to 2, n5 to n8 are each independently 0 or 1, and X is —O— or —S—,

[Chemical Formula 6]

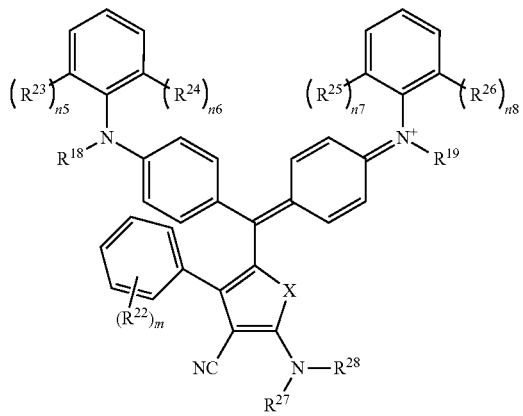

wherein, in Chemical Formula 6, $R^{18}$ and $R^{19}$ are each independently a substituted or unsubstituted C1 to C20 alkyl group, $R^{22}$ is a halogen atom, $R^{23}$ to $R^{26}$ are each independently a halogen atom or a substituted or unsubstituted C1 to C 10 alkyl group, $R^{27}$ and $R^{28}$ are each independently a substituted or unsubstituted C6 to C20 aryl group, m is an integer of 0 to 2, n5 to n8 are each independently 0 or 1, and X is —O— or —S—,

[Chemical Formula 7]

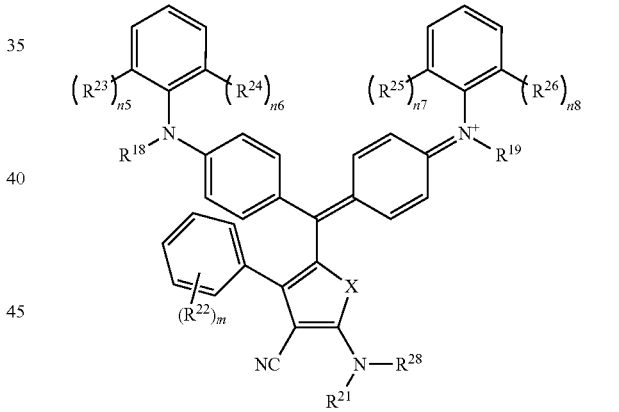

wherein, in Chemical Formula 7, $R^{18}$, $R^{19}$, and $R^{21}$ are each independently a substituted or unsubstituted C1 to C20 alkyl group, $R^{22}$ is a halogen atom, $R^{23}$ to $R^{26}$ are each independently a halogen atom or a substituted or unsubstituted C1 to C 10 alkyl group, $R^{28}$ is a substituted or unsubstituted C6 to C20 aryl group, m is an integer of 0 to 2, n5 to n8 are each independently 0 or 1, and X is —O— or —S—.

The cation represented by Chemical Formula 1 may be represented one of the following Chemical Formula 5-3, Chemical Formula 5-4, Chemical Formula 5-5, Chemical Formula 5-6, Chemical Formula 7-6, Chemical Formula 7-8, Chemical Formula 7-10, Chemical Formula 7-12, Chemical Formula 7-14, and Chemical Formula 7-17:

[Chemical Formula 5-3]
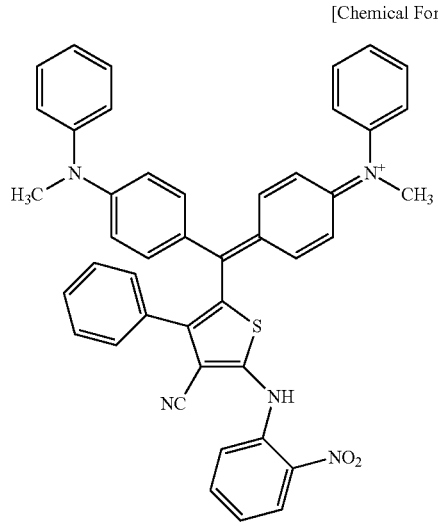
[Chemical Formula 5-6]
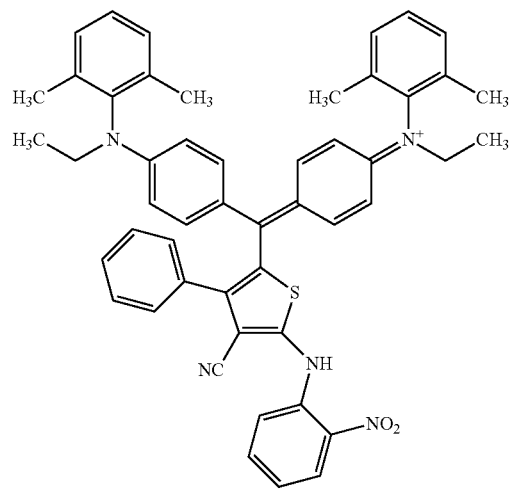
[Chemical Formula 5-4]
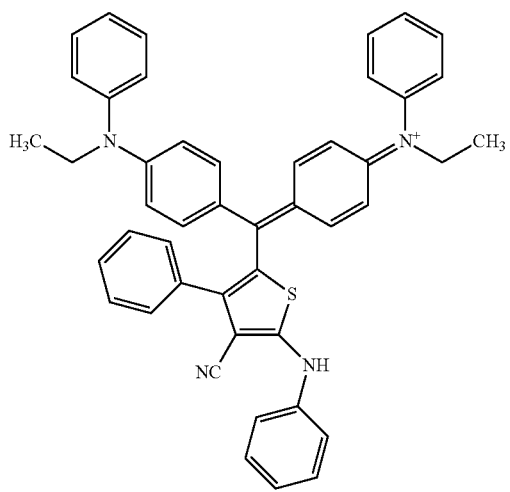
[Chemical Formula 7-6]
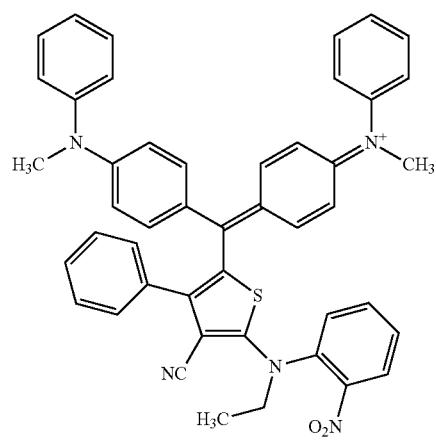
[Chemical Formula 5-5]
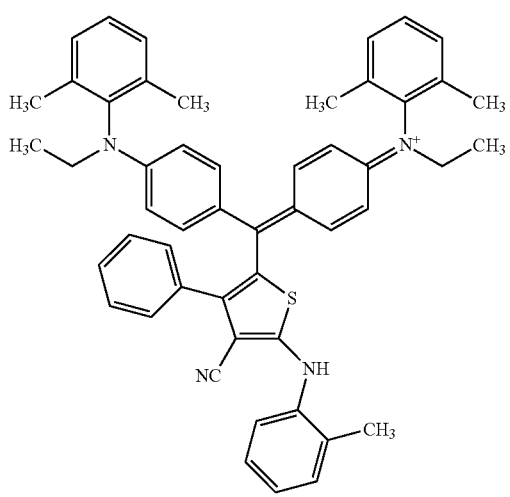
[Chemical Formula 7-8]
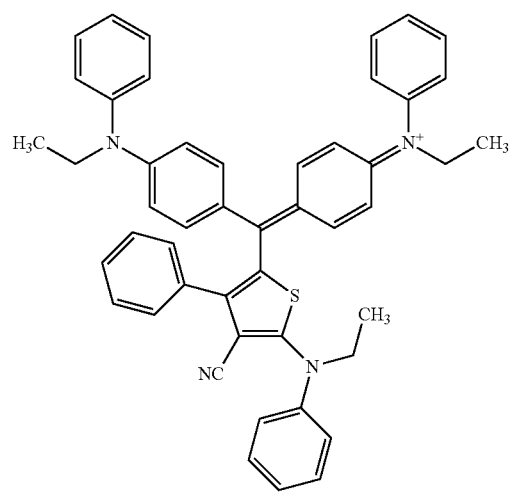

-continued

[Chemical Formula 7-10]

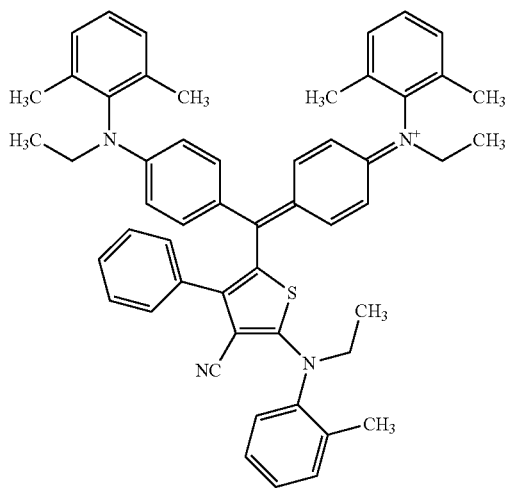

[Chemical Formula 7-12]

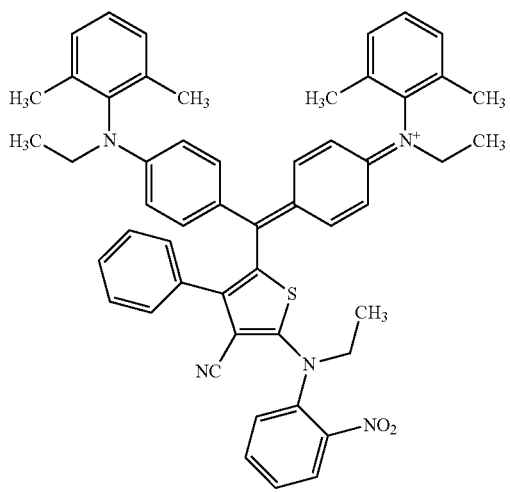

[Chemical Formula 7-14]

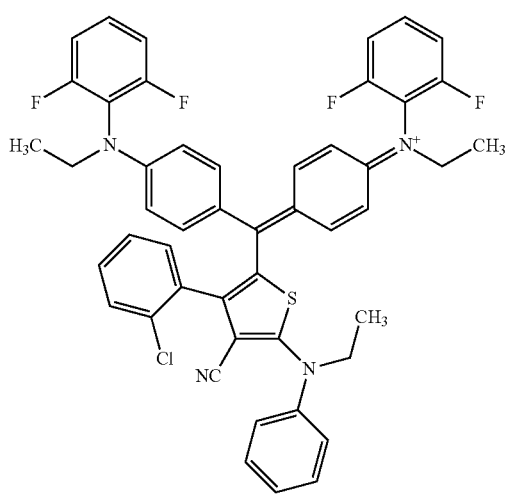

-continued

[Chemical Formula 7-17]

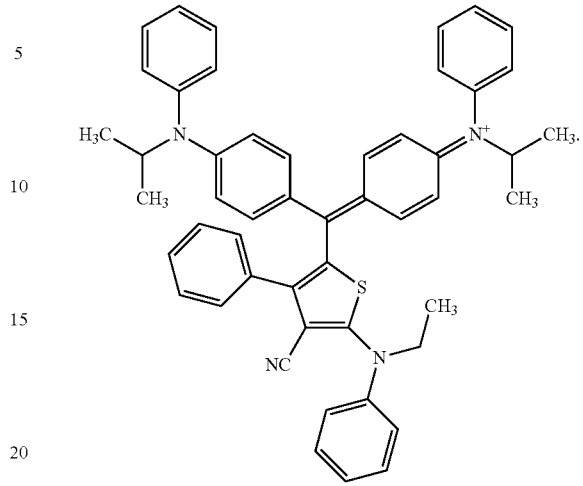

The anion may be represented by one of the following Chemical Formula A to Chemical Formula F:

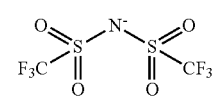
[Chemical Formula A]

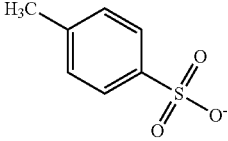
[Chemical Formula B]

$PW_{12}O_{40}^{3-}$ [Chemical Formula C]

$SiW_{12}O_{40}^{4-}$ [Chemical Formula D]

$CF_3SO_3^-$ [Chemical Formula E]

$ClO_4^-$. [Chemical Formula F]

The dye may be a blue dye.

The dye may have a maximum absorbance ($\lambda_{max}$) in a wavelength of about 600 nm to about 700 nm.

The dye may have a maximum transmittance ($\lambda_{max}$) in a wavelength of about 400 nm to about 500 nm.

The photosensitive resin composition may further include a pigment.

The binder resin may have an a weight average molecular weight of about 5,000 g/mol to about 15,000 g/mol.

The binder resin may have an acid value of about 80 mgKOH/g to about 130 mgKOH/g.

The binder resin may include an acryl-based binder resin, a cardo-based binder resin, or a combination thereof.

The photosensitive resin composition may include about 1 wt % to about 30 wt % of the binder resin; the about 15 wt % to about 40 wt % of the dye; about 1 wt % to about 15 wt % of the photopolymerizable compound; about 0.01 wt % to about 10 wt % of the photopolymerization initiator, and a balance amount of the solvent, all wt % being based on the total weight of the photosensitive resin composition.

The photosensitive resin composition may further include an epoxy compound, malonic acid, 3-amino-1,2-propanediol, a silane-based coupling agent, a leveling agent, a surfactant, a radical polymerization initiator, or a combination thereof.

The embodiments may be realized by providing a photosensitive resin film manufactured using the photosensitive resin composition according to an embodiment.

The embodiments may be realized by providing a color filter including the photosensitive resin film according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening elements may also be present.

As used herein, when specific definition is not otherwise provided, the term "substituted" refers to replacement by a substituent selected from a halogen (F, Br, Cl, or I), a hydroxy group, a nitro group, a cyano group, an amino group ($NH_2$, $NH(R^{200})$ or $N(R^{201})(R^{202})$ wherein $R^{200}$, $R^{201}$, and $R^{202}$ are the same or different, and are independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group and a substituted or unsubstituted heterocyclic group instead of a functional group of the present invention.

As used herein, when specific definition is not otherwise provided, the term "alkyl group" refers to a C1 to C20 alkyl group, and specifically a C1 to C15 alkyl group, the term "cycloalkyl group" refers to a C3 to C20 cycloalkyl group, and specifically a C3 to C18 cycloalkyl group, the term "alkoxy group" refers to a C1 to C20 alkoxy group, and specifically a C1 to C18 alkoxy group, the term "aryl group" refers to a C6 to C20 aryl group, and specifically a C6 to C18 aryl group, the term "alkenyl group" refers to a C2 to C20 alkenyl group, and specifically a C2 to C18 alkenyl group, the term "alkylene group" refers to a C1 to C20 alkylene group, and specifically C1 to C18 alkylene group, and the term "arylene group" refers to a C6 to C20 arylene group, and specifically a C6 to C16 arylene group.

As used herein, when specific definition is not otherwise provided, "(meth)acrylate" refers to "acrylate" and "methacrylate," and "(meth)acrylic acid" refers to "acrylic acid" and "methacrylic acid".

As used herein, when a definition is not otherwise provided, the term "combination" refers to mixing or copolymerization. In addition, "copolymerization" refers to block copolymerization, random copolymerization, or the like, and "copolymer" refers to a block copolymer, a random copolymer, or the like.

In the chemical formula of the present specification, unless a specific definition is otherwise provided, hydrogen is bonded at the position when a chemical bond is not drawn where supposed to be given.

As used herein, when specific definition is not otherwise provided, "*" indicates a point where the same or different atom or Chemical Formula is linked.

A photosensitive resin composition according to an embodiment may include, e.g., (A) a binder resin; (B) a dye (e.g., including or consisting of a cation and an anion); (C) a photopolymerizable compound; (D) a photopolymerization initiator and (E) a solvent. In an implementation, the dye may be included in the composition in an amount of, e.g., about 15 wt % to about 40 wt %, based on a total weight of a photosensitive resin composition. In an implementation, the cation may be represented by the following Chemical Formula 1.

[Chemical Formula 1]

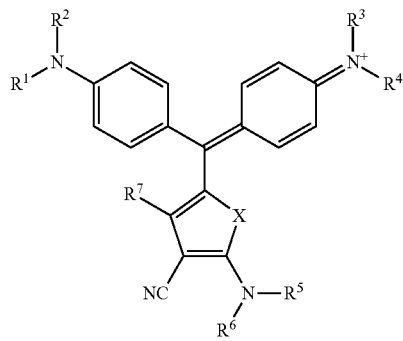

In Chemical Formula 1, $R^1$ to $R^6$ may each independently be or include, e.g., a hydrogen atom, a substituted or unsubstituted C1 to C20 alkyl group, a substituted or unsubstituted C6 to C20 aryl group, or a substituted or unsubstituted C2 to C20 heteroaryl group.

$R^7$ may be or may include, e.g., a substituted or unsubstituted C6 to C20 aryl group.

X may be, e.g., —O—, —S—, or —$NR^8$—. $R^8$ may be or may include, e.g., a hydrogen atom, a substituted or unsubstituted C1 to C10 alkyl group or a substituted or unsubstituted C6 to C20 aryl group.

In an implementation, the photosensitive resin composition may include a dye consisting of an anion and the cation represented by Chemical Formula 1, in an amount of about 15 wt % to about 40 wt %, based on the total weight of the photosensitive resin composition. For example, when the dye is included within the amount range, the dye may have excellent spectral characteristics, a high molar extinction coefficient, and excellent coloring properties, heat resistance,and solubility un an organic solvent such as cyclohexanone, PGMEA, and the like, compared with a another compound used as a colorant, e.g., a triarylmethane compound. For example, the cation represented by Chemical Formula 1 has three rings connected to carbon in the center, one ring of the three rings may be an aromatic hetero ring including a cyano group, and a photosensitive resin composition including the dye according to an embodiment and within the amount described above may provide a color filter having excellent luminance, heat resistance, chemical resistance, and light resistance.

Hereinafter, each component is described in detail.

(B) Dye

As described above, a photosensitive resin composition according to an embodiment may include a dye consisting of a cation and an anion. In an implementation, the cation may be represented by Chemical Formula 1.

In an implementation, X may be —O— or —S—.

In an implementation, $R^1$ to $R^4$ may each independently be or include, e.g., a substituted or unsubstituted C1 to C20 alkyl group or a substituted or unsubstituted C6 to C20 aryl group.

In order to manufacture a color filter having excellent heat resistance, light resistance, and chemical resistance as well as high luminance, a dye having excellent durability may be synthesized (rather than a pigment) and a composition including the dye may be used. For example, as for the dye, a triarylmethane compound could be used as a blue dye. The triarylmethane dye may have high luminance within a wavelength ranging from about 420 nm to about 450 nm but may exhibit insufficient solubility in an organic solvent such as PGMEA and the like and may also exhibit weak heat resistance, light resistance, and chemical resistance. In order to address the above-described concerns, an anion such as naphthalene sulfonic acid, naphthyl amine sulfonic acid, and the like as the triarylmethane dye may be used, but heat resistance and the like may not be sufficiently improved.

The dye included in the composition according to an embodiment may include the cation represented by Chemical Formula 1 and thus may have excellent spectral characteristics, a high molar extinction coefficient, excellent coloring properties, heat resistance, light resistance, and chemical resistance, and excellent solubility in an organic solvent such as cyclohexanone, PGMEA, and the like, compared with other compounds used as a colorant, e.g., a triarylmethane compound. For example, the dye included in the composition according to an embodiment may have three rings connected to carbon in the center, one ring of the three rings may be an aromatic hetero ring including a cyano group, and the composition of an embodiment may provide a color filter having excellent heat resistance, light resistance, and chemical resistance as well as high luminance.

In an implementation, the cation may be represented by Chemical Formula 2.

[Chemical Formula 2]

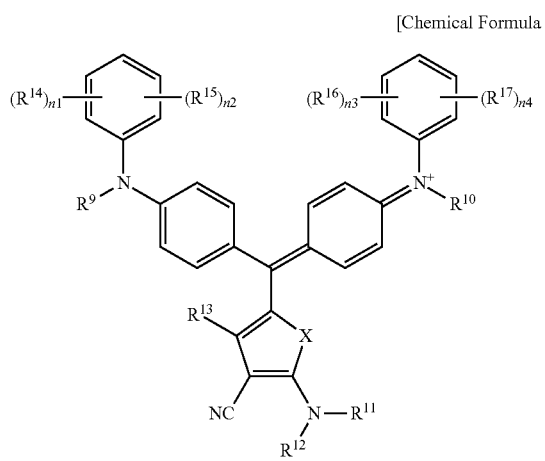

In Chemical Formula 2, $R^9$ and $R^{10}$ may each independently be or include, e.g., a substituted or unsubstituted C1 to C20 alkyl group.

$R^{11}$ and $R^{12}$ may each independently be or include, e.g., a hydrogen atom, a substituted or unsubstituted C1 to C20 alkyl group, or a substituted or unsubstituted C6 to C20 aryl group.

$R^{13}$ may be or include, e.g., a substituted or unsubstituted C6 to C20 aryl group.

$R^{14}$ to $R^{17}$ may each independently be or include, e.g., a halogen atom or a substituted or unsubstituted C1 to C10 alkyl group.

n1 to n4 may each independently be, e.g., an integers of 0 to 5, such that $0 \leq n1+n2 \leq 5$, and $0 \leq n3+n4 \leq 5$.

X may be, e.g., —O— or —S—.

In an implementation, n1 to n4 may each independently be 0 or 1.

In an implementation, the halogen atom may be F, Cl, Br, or I.

In an implementation, the cation may be represented by one of the following

Chemical Formula 3 to Chemical Formula 7.

[Chemical Formula 3]

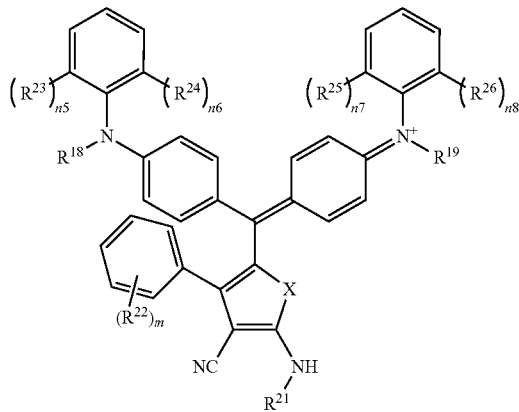

In Chemical Formula 3, $R^{18}$, $R^{19}$, and $R^{21}$ may each independently be or include, e.g., a substituted or unsubstituted C1 to C20 alkyl group.

$R^{22}$ may be, e.g., a halogen atom.

$R^{23}$ to $R^{26}$ may each independently be or include, e.g., a halogen atom or a substituted or unsubstituted C1 to C10 alkyl group.

m may be, e.g., an integer of 0 to 2.

n5 to n8 may each independently be, e.g., 0 or 1.

X may be, e.g., —O— or —S—.

[Chemical Formula 4]

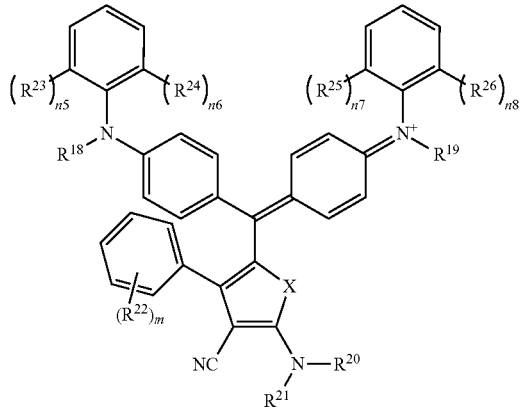

In Chemical Formula 4, $R^{18}$ to $R^{21}$ may each independently be or include, e.g., a substituted or unsubstituted C1 to C20 alkyl group.

$R^{22}$ may be, e.g., a halogen atom.

$R^{23}$ to $R^{26}$ may each independently be or include, ex., a halogen atom or a substituted or unsubstituted C1 to C10 alkyl group.

m may be, e.g., an integer of 0 to 2.

n5 to n8 may each independently be, e.g., 0 or 1.

X may be, e.g., —O— or —S—.

[Chemical Formula 5]

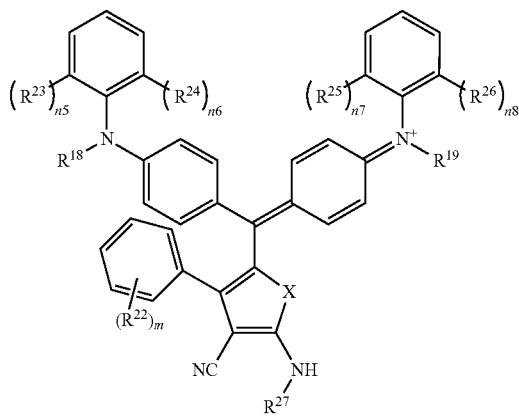

In Chemical Formula 5, $R^{18}$ and $R^{19}$ may each independently be or include, e.g., a substituted or unsubstituted C1 to C20 alkyl group.

$R^{22}$ may be, e.g., a halogen atom.

$R^{23}$ to $R^{26}$ may each independently be or include, e.g., a halogen atom or a substituted or unsubstituted C1 to C10 alkyl group.

$R^{27}$ may be or may include, e.g., a substituted or unsubstituted C6 to C20 aryl group.

m may be, e.g., an integer of 0 to 2.

n5 to n8 may each independently be, e.g., 0 or 1.

X may be, e.g., —O— or —S—.

[Chemical Formula 6]

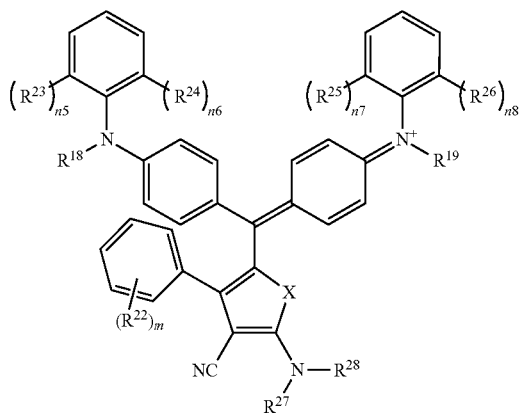

In Chemical Formula 6, $R^{18}$ and $R^{19}$ may each independently be or include, e.g., a substituted or unsubstituted C1 to C20 alkyl group.

$R^{22}$ may be, e.g., a halogen atom.

$R^{23}$ to $R^{26}$ may each independently be or include, e.g., a halogen atom or a substituted or unsubstituted C1 to C10 alkyl group.

$R^{27}$ and $R^{28}$ may each independently be or include, e.g., a substituted or unsubstituted C6 to C20 aryl group.

m may be, e.g., an integer of 0 to 2.

n5 to n8 may each independently be, e.g., 0 or 1.

X may be, e.g., —O— or —S—.

[Chemical Formula 7]

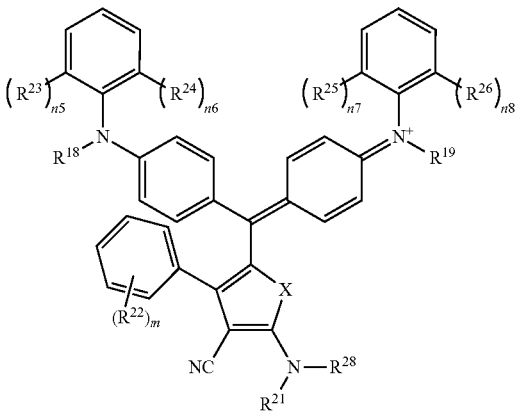

In Chemical Formula 7, $R^{18}$, $R^{19}$, and $R^{21}$ may each independently be or include, e.g., a substituted or unsubstituted C1 to C20 alkyl group.

$R^{22}$ may be, e.g., a halogen atom.

$R^{23}$ to $R^{26}$ may each independently be or include, e.g., a halogen atom or a substituted or unsubstituted C1 to C10 alkyl group.

$R^{28}$ may be or may include, e.g., a substituted or unsubstituted C6 to C20 aryl group.

m may be, e.g., an integer of 0 to 2.

n5 to n8 may each independently be, e.g., 0 or 1.

X may be, e.g., —O— or —S—.

In an implementation, the cation may be represented by one of the following Chemical Formula 3-1, Chemical Formula 3-2, Chemical Formula 4-1 to Chemical Formula 4-3, Chemical Formula 5-1 to Chemical Formula 5-8, Chemical Formula 6-1 to Chemical Formula 6-19, and Chemical Formula 7-1 to Chemical Formula 7-17.

[Chemical Formula 3-1]
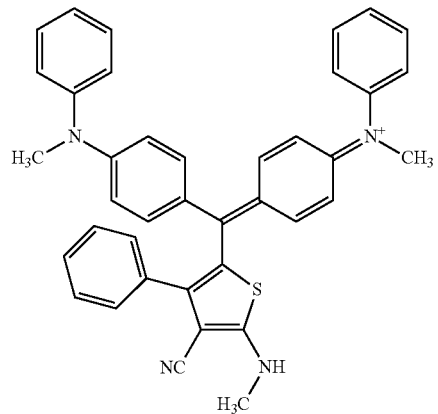
[Chemical Formula 3-2]
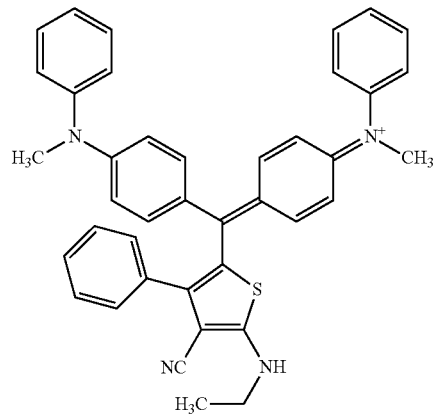
[Chemical Formula 4-1]
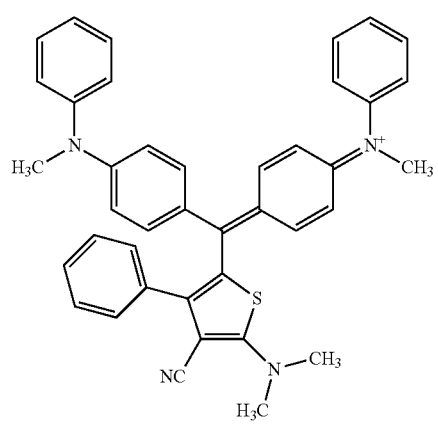
[Chemical Formula 4-2]
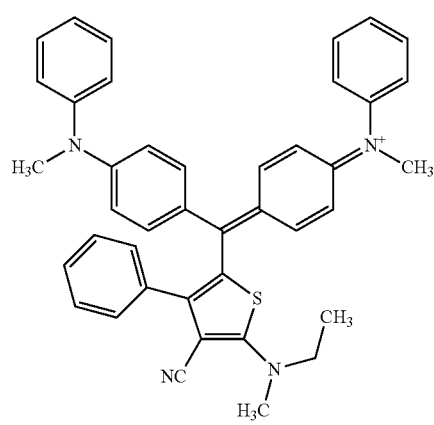
[Chemical Formula 4-3]
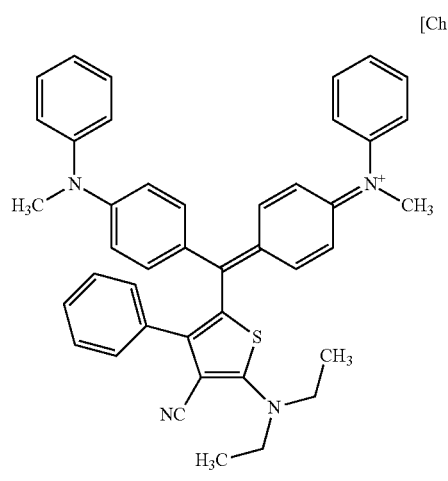
[Chemical Formula 5-1]
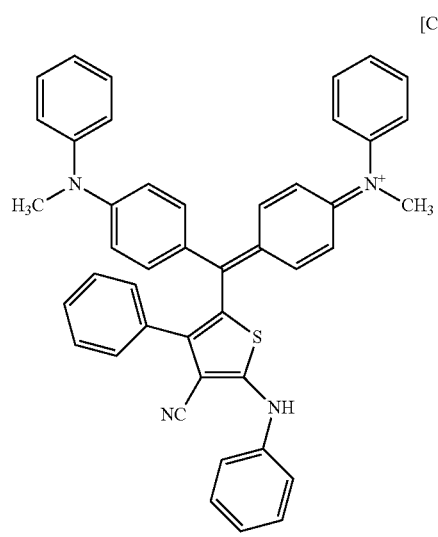

-continued
[Chemical Formula 5-2]
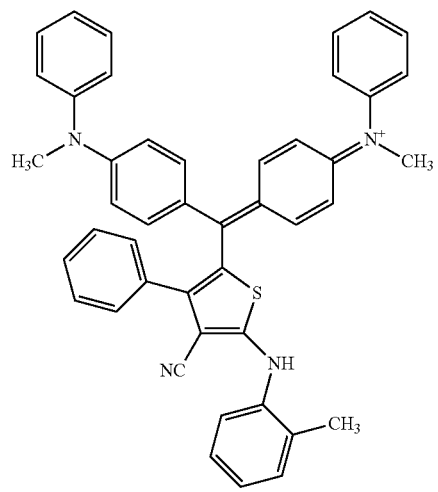
[Chemical Formula 5-3]
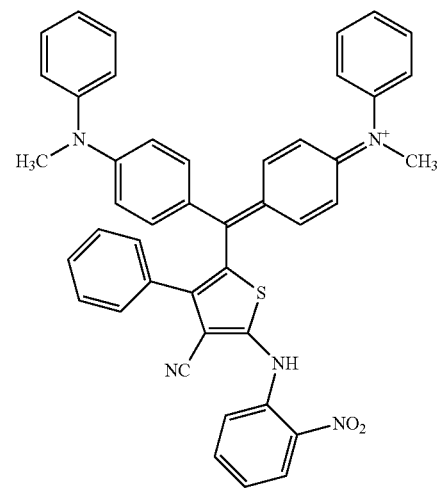
[Chemical Formula 5-4]
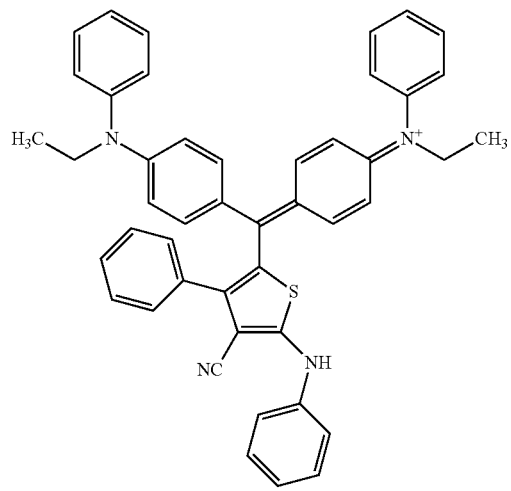
[Chemical Formula 5-5]
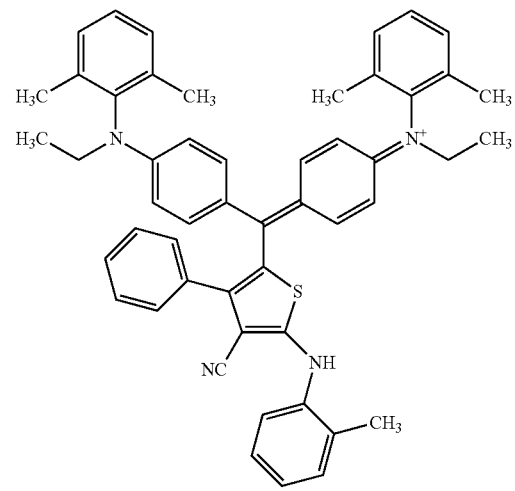
[Chemical Formula 5-6]
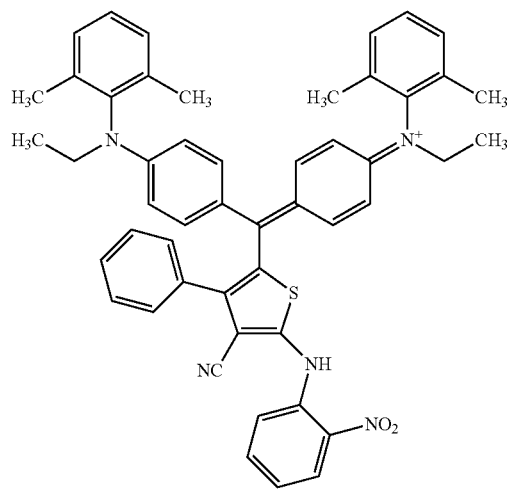
[Chemical Formula 5-7]
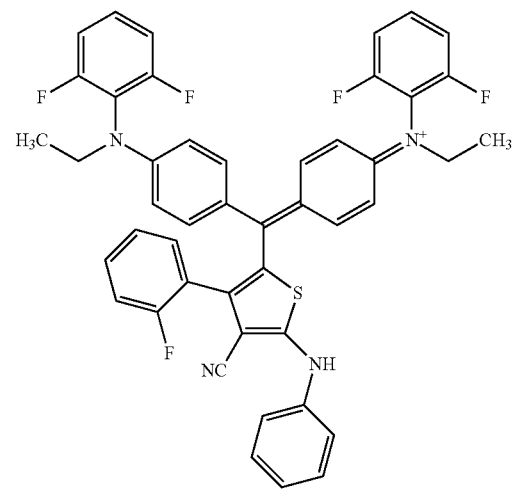

-continued
[Chemical Formula 5-8]
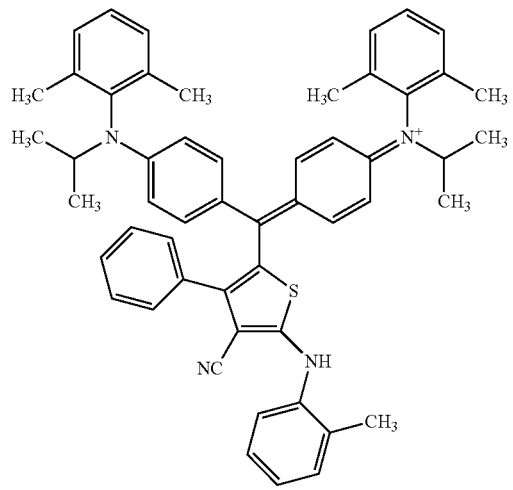
[Chemical Formula 6-1]
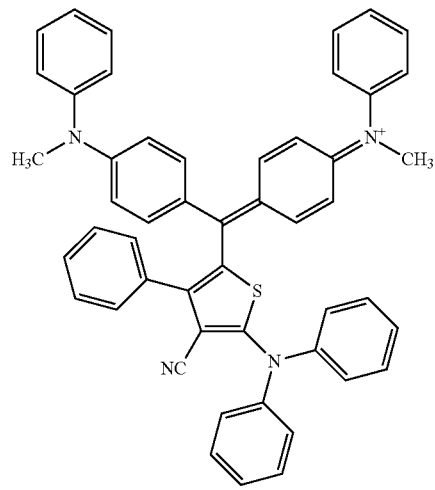
[Chemical Formula 6-2]
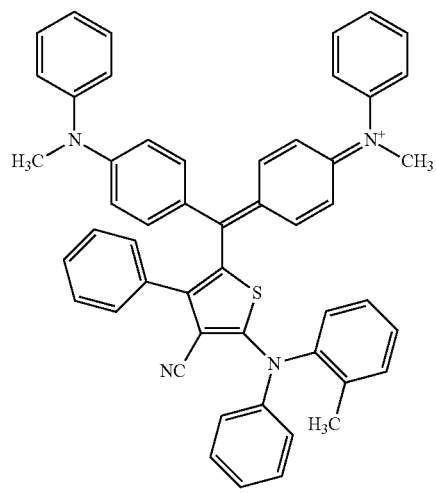
[Chemical Formula 6-3]
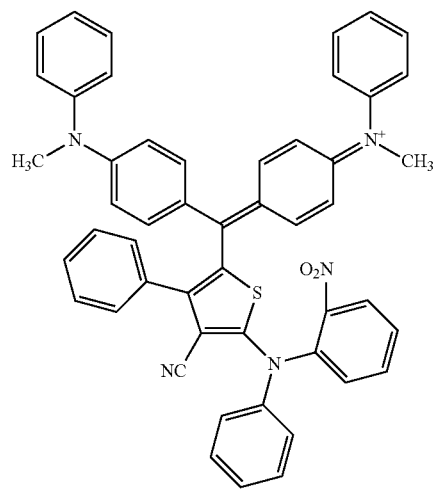
[Chemical Formula 6-4]
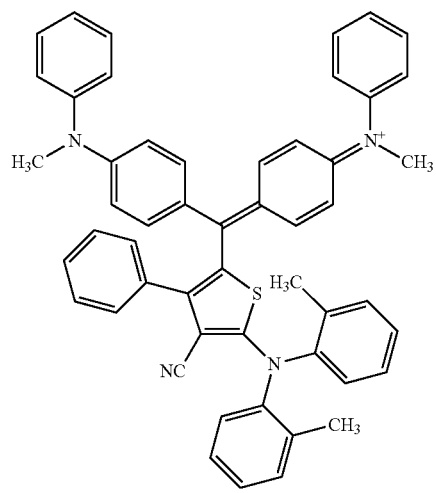
[Chemical Formula 6-5]
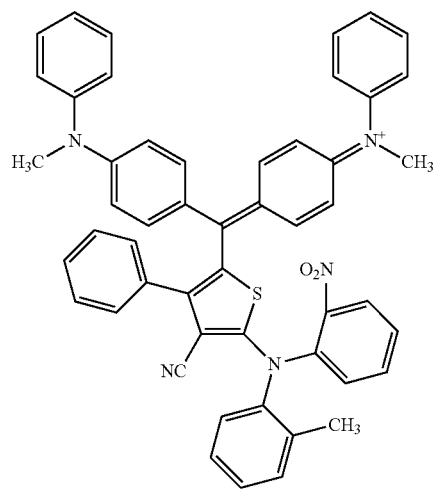

-continued
[Chemical Formula 6-6]
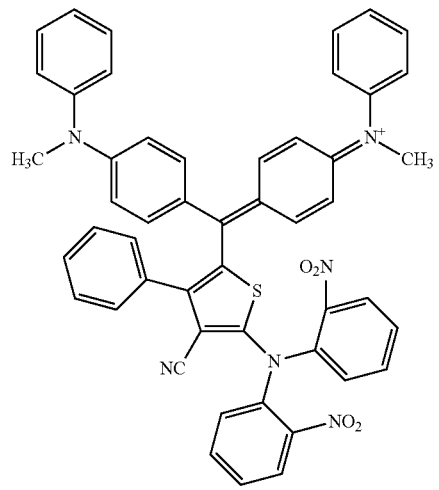
[Chemical Formula 6-7]
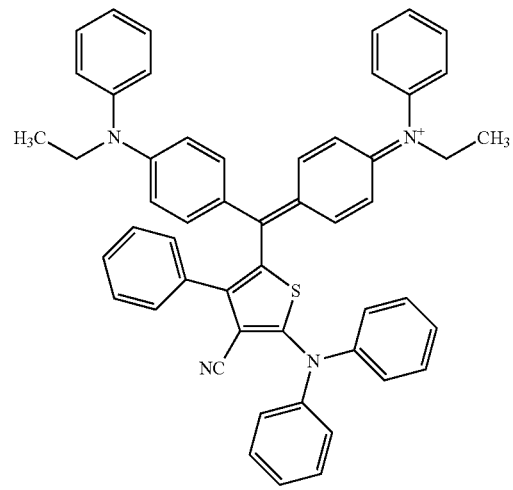
[Chemical Formula 6-8]
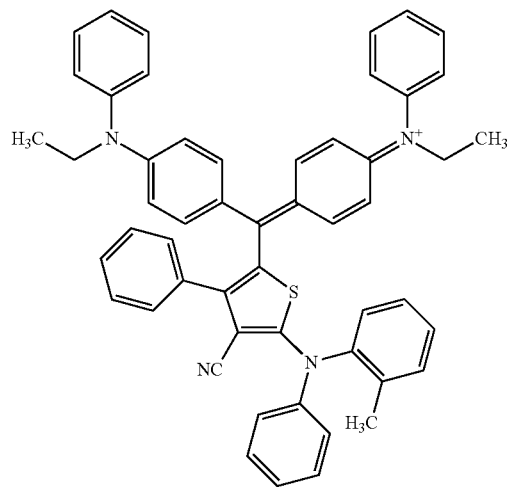
[Chemical Formula 6-9]
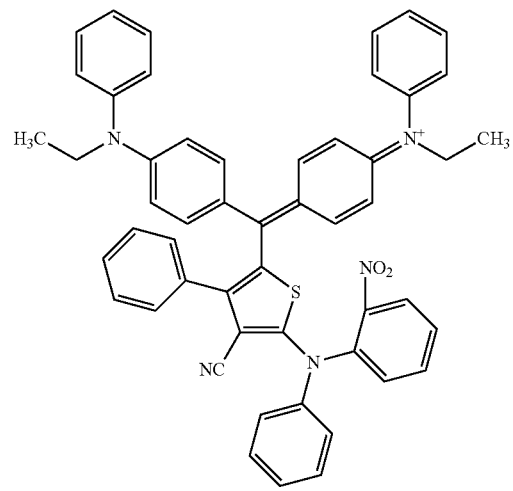
[Chemical Formula 6-10]
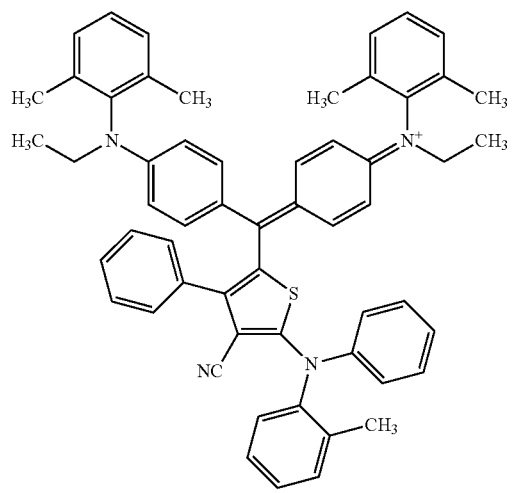
[Chemical Formula 6-11]
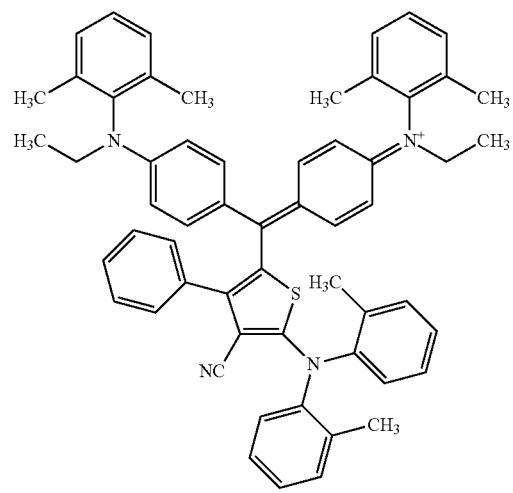

-continued
[Chemical Formula 6-12]
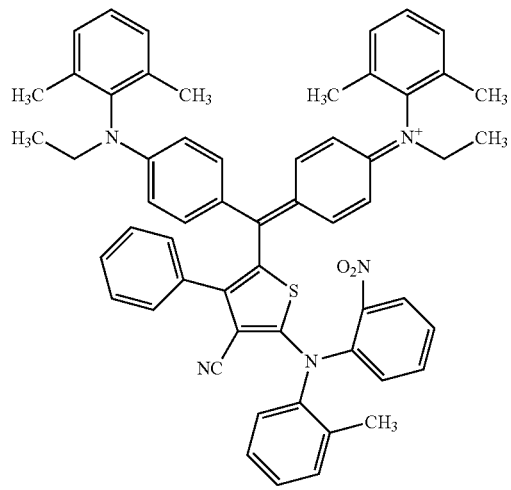
[Chemical Formula 6-13]
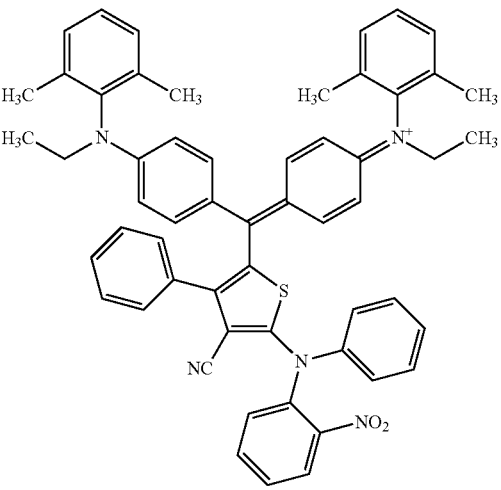
[Chemical Formula 6-14]
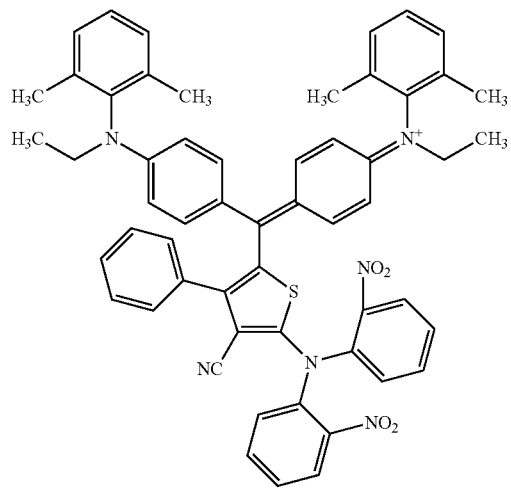
[Chemical Formula 6-15]
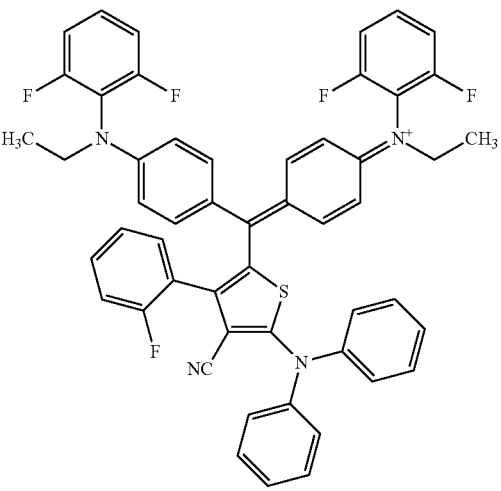
[Chemical Formula 6-16]
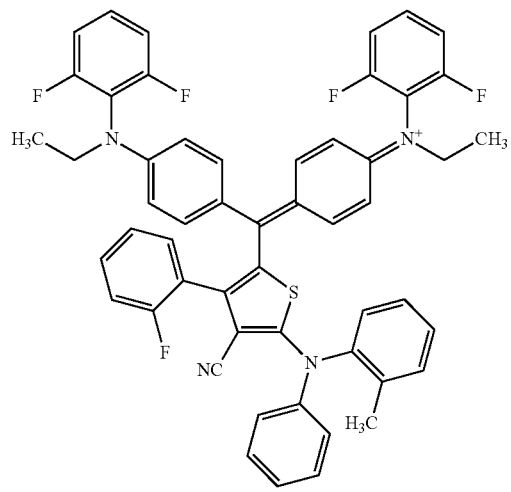
[Chemical Formula 6-17]
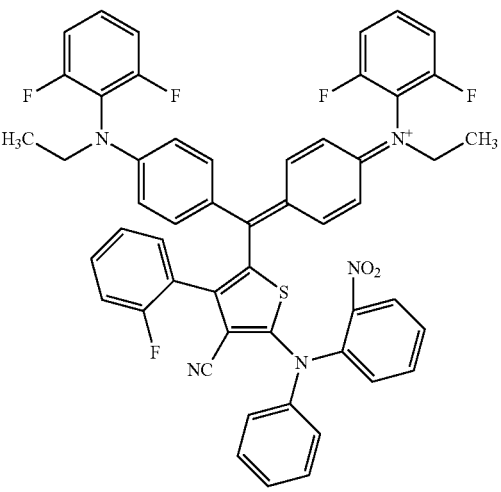

[Chemical Formula 6-18]
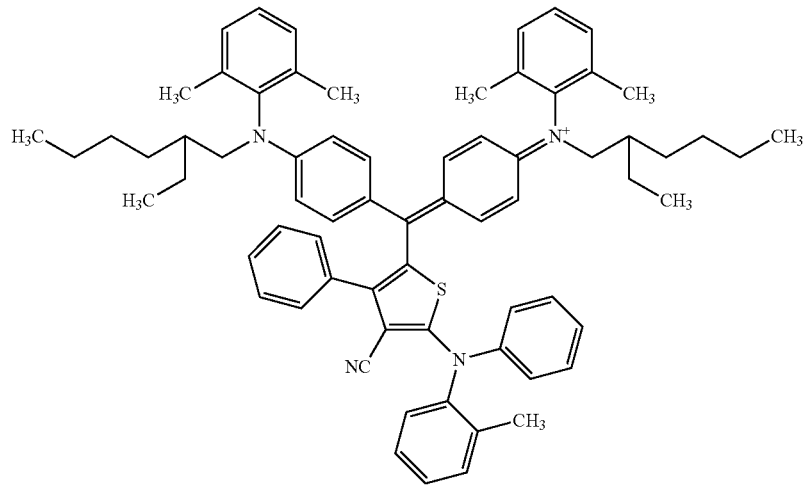
[Chemical Formula 6-19]
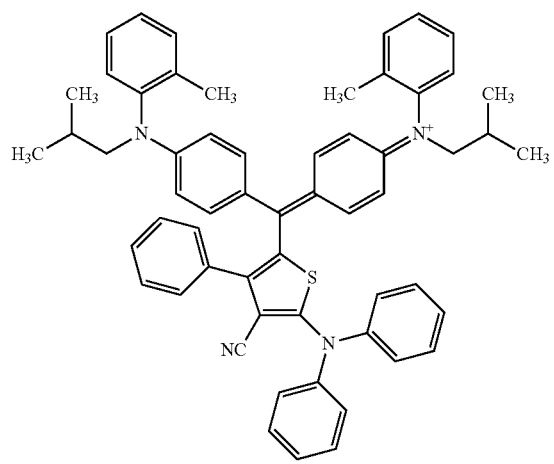
[Chemical Formula 7-1]
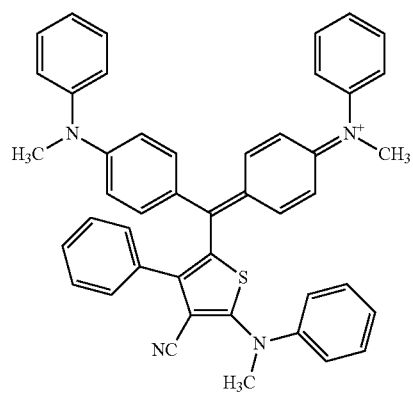
[Chemical Formula 7-2]
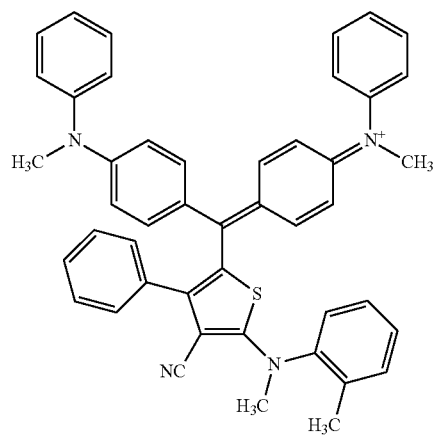
[Chemical Formula 7-3]
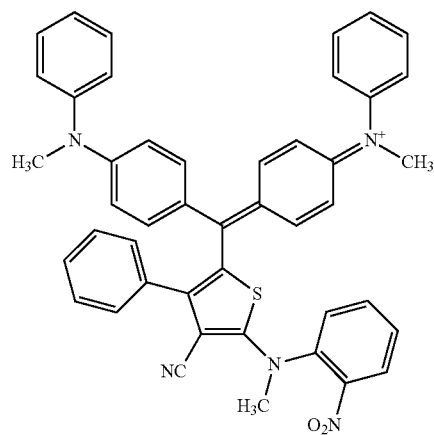

-continued
[Chemical Formula 7-4]
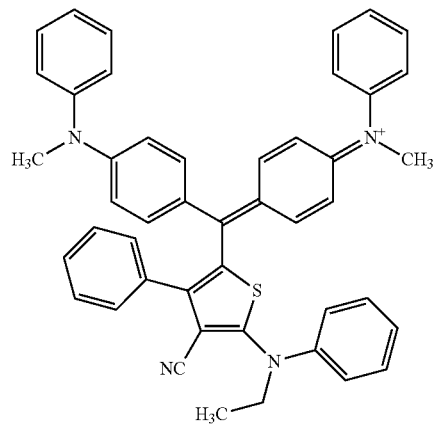
[Chemical Formula 7-5]
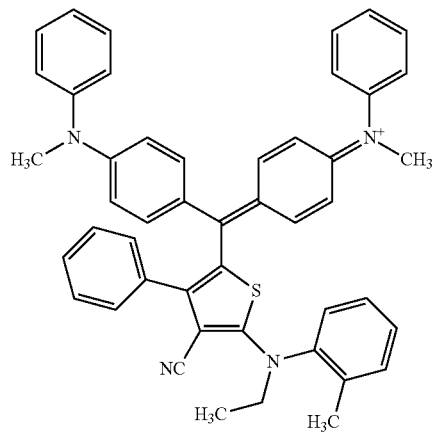
[Chemical Formula 7-6]
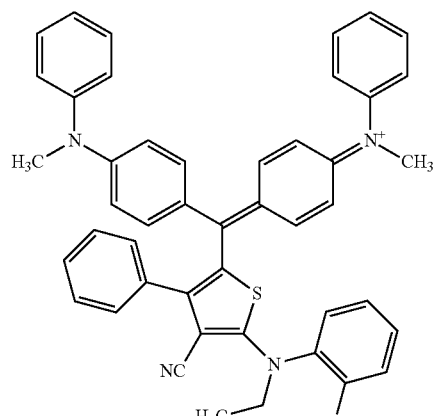
[Chemical Formula 7-7]
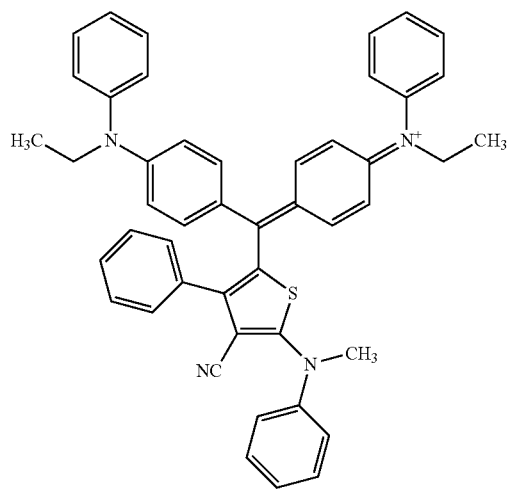
[Chemical Formula 7-8]
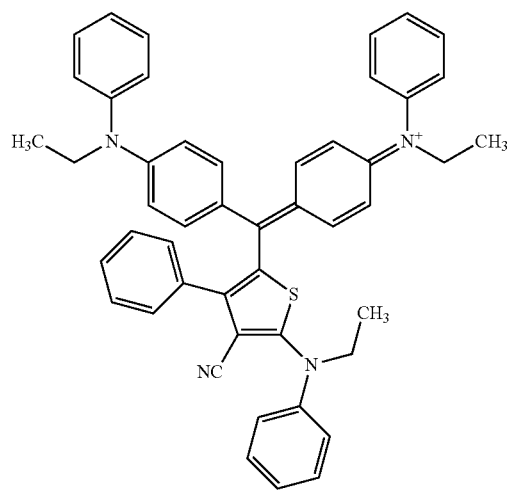
[Chemical Formula 7-9]
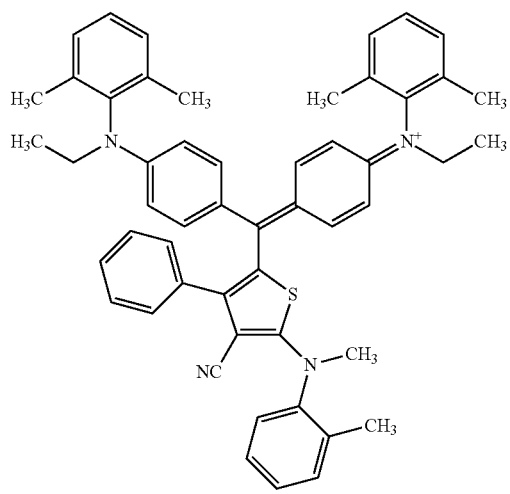

-continued
[Chemical Formula 7-10]
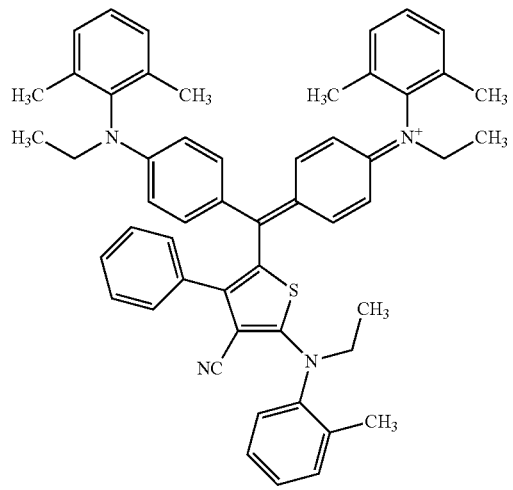
[Chemical Formula 7-11]
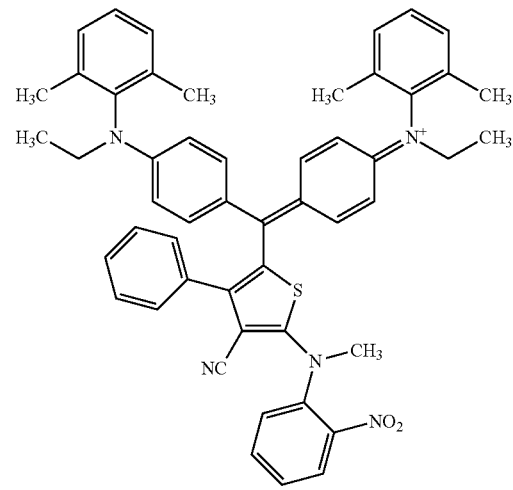
[Chemical Formula 7-12]
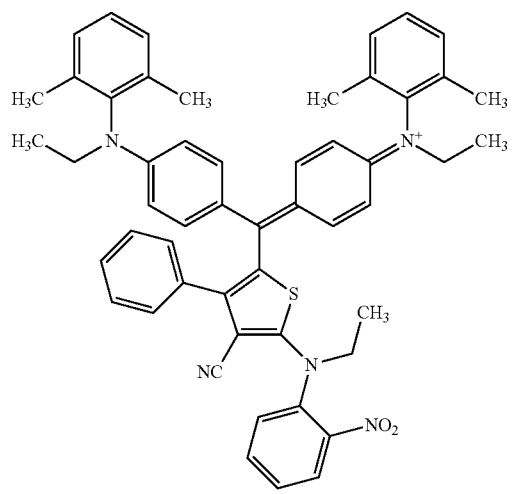
[Chemical Formula 7-13]
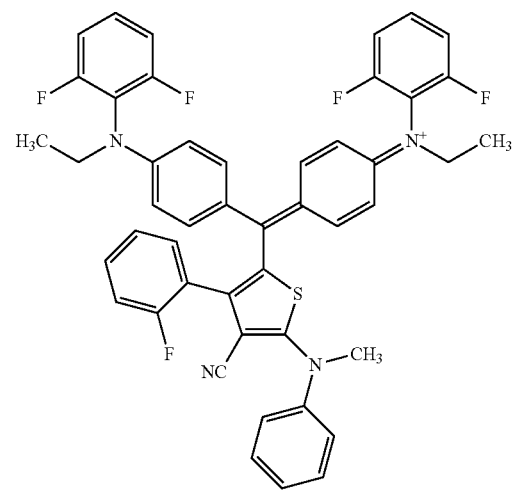
[Chemical Formula 7-14]
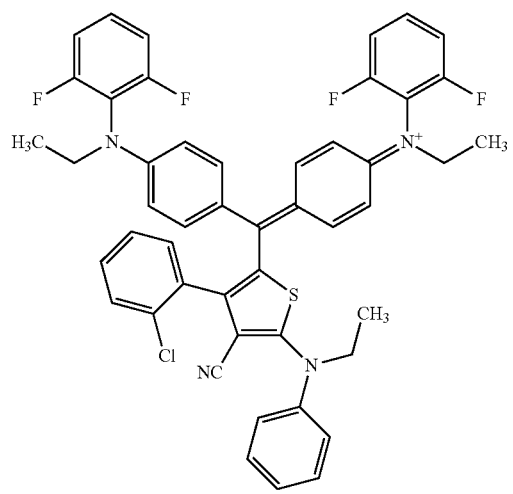
[Chemical Formula 7-15]
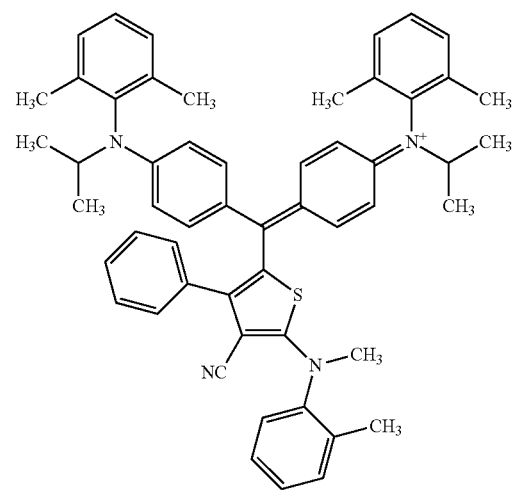

-continued

[Chemical Formula 7-16]

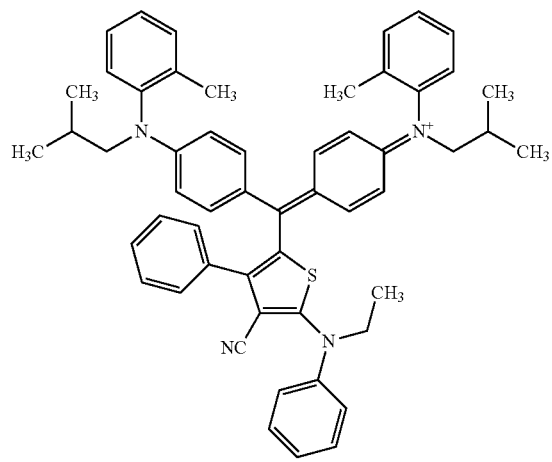

[Chemical Formula 7-17]

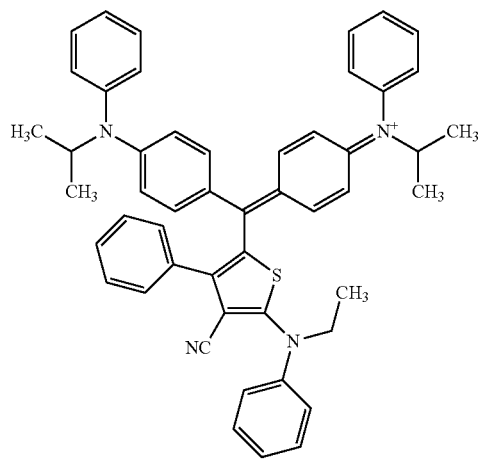

The compound according to an embodiment may include an anion. In an implementation, the anion may be represented by one of the following Chemical Formulae A to F.

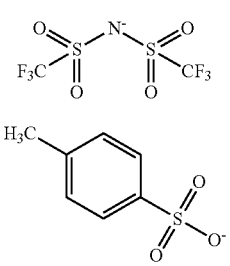
[Chemical Formula A]

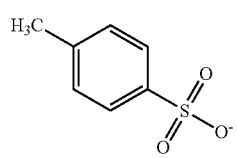
[Chemical Formula B]

$PW_{12}O_{40}^{3-}$ [Chemical Formula C]

$SiW_{12}O_{40}^{4-}$ [Chemical Formula D]

$CF_3SO_3^-$ [Chemical Formula E]

$ClO_4^-$ [Chemical Formula F]

The dye in the composition according to an embodiment may express a clear color even in a small amount. When the dye according to an embodiment is used as a colorant, a display device having excellent color characteristics such as luminance, a contrast ratio, and the like may be manufactured, e.g., due to the presence of the cation represented by Chemical Formula 1. In an implementation, the dye may be, e.g., a blue dye having a maximum absorbance ($\lambda_{max}$) in a wavelength range of about 600 nm to about 700 nm. In an implementation, the dye may be a dye having a maximum absorbance ($\lambda_{max}$) in a wavelength range of about 630 nm to about 670 nm, e.g., in a wavelength range of about 640 nm to about 650 nm. In an implementation, the dye may be a dye having maximum transmittance ($T_{max}$) in a wavelength range of about 400 nm to about 500 nm, e.g., about 420 nm to about 450 nm or about 430 nm to about 440 nm.

A dye may be the most expensive among the components used in a color filter. Accordingly, more of the expensive dye may be used in order to accomplish a desired effect, e.g., high luminance, a high contrast ratio, or the like. Thus, the unit cost of production could increase. However, when the dye in the composition according to an embodiment is used as a dye in a color filter, the compound may accomplish excellent color characteristics such as high luminance, a high contrast ratio, and the like and reduce the unit cost of production even though the dye is used or included in only a small amount.

In an implementation, the dye may be included in the composition in an amount of about 10 wt % to about 40 wt %, e.g., about 15 wt % to about 40 wt % or about 15 wt % to about 30 wt %, based on the total weight of the photosensitive resin composition. When the compound according to an embodiment is included within the range, heat resistance, light resistance and chemical resistance as well as color reproducibility and luminance simultaneously become excellent.

(B') Pigment

In an implementation, the photosensitive resin composition according to an embodiment may further include a pigment.

In an implementation, the pigment may include, e.g., a blue pigment, a yellow pigment, a green pigment, a red pigment, a violet pigment, or a combination thereof. In an implementation, the pigment may be included in a form of pigment dispersion liquid in the photosensitive resin composition.

The pigment dispersion liquid may include a solid pigment, a solvent, and a dispersing agent in order to disperse the pigment in the solvent uniformly.

In an implementation, the solid pigment may be included in an amount of about 1 wt % to about 20 wt %, e.g., about 8 wt % to about 20 wt %, about 15 wt % to about 20 wt %, about 8 wt % to about 15 wt %, about 10 wt % to about 20 wt %, or about 10 wt % to about 15 wt %, based on a total weight of pigment dispersion liquid.

The dispersing agent may be a non-ionic dispersing agent, an anionic dispersing agent, a cationic dispersing agent, or the like. Examples of the dispersing agent may include polyalkylene glycol and esters thereof, polyoxyalkylene, polyhydric alcohol ester alkylene oxide addition product, alcoholalkylene oxide addition product, sulfonate ester, sulfonate salt, a carboxylate ester, a carboxylate salt, an alkylamide alkylene oxide addition product, alkyl amine, or the like, and may be used singularly or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse 24000GR, Solsperse 27000, Solsperse 28000, and the like made by Zeneka Co.; or PB711, or PB821 made by Ajinomoto Inc.

The dispersing agent may be included in an amount of about 1 wt % to about 20 wt %, based on the total weight of the pigment dispersion liquid. When the dispersing agent is included within the range, dispersion of a photosensitive resin composition is improved due to an appropriate viscosity, and thus optical, physical, and chemical quality may be maintained when the photosensitive resin composition is applied to products.

The solvent for forming the pigment dispersion liquid may include, e.g., ethylene glycol acetate, ethylcellosolve, propylene glycol monomethyl ether acetate, ethyllactate, polyethylene glycol, cyclohexanone, propylene glycol methylether, or the like.

In an implementation, the pigment dispersion liquid may be included in an amount of about 5 wt % to about 30 wt %, e.g., about 10 wt % to about 25 wt %, based on the total weight of the photosensitive resin composition. When the pigment dispersion liquid is included within the range, a process margin may be ensured, and color reproducibility and a contrast ratio are improved.

(A) Binder Resin

In an implementation, the binder resin may include, e.g., an acryl-based binder resin, a cardo-based binder resin, or a combination thereof.

The acryl-based binder resin may include, e.g., a copolymer of a first ethylenic unsaturated monomer and a second ethylenic unsaturated monomer that is copolymerizable therewith, and may be resin including at least one acryl-based repeating unit.

The first ethylenic unsaturated monomer may include, e.g., an ethylenic unsaturated monomer including at least one carboxyl group. Examples of the monomer may include (meth)acrylic acid, maleic acid, itaconic acid, fumaric acid, or a combination thereof.

The first ethylenic unsaturated monomer may be included in an amount of about 5 wt % to about 50 wt %, e.g., about 10 wt % to about 40 wt %, based on a total weight of the acryl-based resin.

The second ethylenic unsaturated monomer may include, e.g., an aromatic vinyl compound such as styrene, α-methylstyrene, vinyl toluene, vinylbenzylmethylether, or the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, or the like; an unsaturated carboxylic acid amino alkyl ester compound such as 2-aminoethyl (meth)acrylate, 2-dimethylaminoethyl(meth)acrylate, or the like; a carboxylic acid vinyl ester compound such as vinyl acetate, vinyl benzoate, or the like; an unsaturated carboxylic acid glycidyl ester compound such as glycidyl(meth) acrylate, or the like; a vinyl cyanide compound such as (meth)acrylonitrile or the like; an unsaturated amide compound such as (meth)acrylamide, or the like; and may be used singularly or as a mixture of two or more.

Examples of the acryl-based binder resin may include a polybenzyl methacrylate copolymer, an acrylic acid/benzyl methacrylate copolymer, a methacrylic acid/benzyl methacrylate copolymer, a methacrylic acid/benzyl methacrylate/styrene copolymer, a methacrylic acid/benzyl methacrylate/2-hydroxyethylmethacrylate copolymer, a methacrylic acid/benzyl methacrylate/styrene/2-hydroxyethylmethacrylate copolymer, and the like. These may be used singularly or as a mixture of two or more.

In an implementation, the binder resin may have a weight average molecular weight of about 5,000 g/mol to about 150,000 g/mol, e.g., about 5,000 g/mol to about 50,000 g/mol or about 10,000 g/mol to about 30,000 g/mol. When the binder resin has a weight average molecular weight within the range, the photosensitive resin composition may exhibit good physical and chemical properties, appropriate viscosity, and close contacting properties with a substrate during manufacture of a color filter.

In an implementation, the binder resin may have an acid value of about 80 mgKOH/g to about 130 mgKOH/g, e.g., about 90 mgKOH/g to about 120 mgKOH/g. When the binder resin has an acid value within the range, a pixel pattern may have excellent resolution.

In an implementation, the binder resin may be included in the composition in an amount of about 1 wt % to about 30 wt %, e.g., about 10 wt % to about 25 wt %, based on the total weight of the photosensitive resin composition. When the binder resin is included within the above range, developability may be improved and excellent surface smoothness may be enhanced due to improved cross-linking during the manufacture of a color filter.

(C) Photopolymerizable Compound

In an implementation, the photopolymerizable compound may be mono-functional or multi-functional ester of (meth) acrylic acid including at least one ethylenic unsaturated double bond.

The photopolymerizable compound has the ethylenic unsaturated double bond and thus, may cause sufficient polymerization during exposure in a pattern-forming process and form a pattern having excellent heat resistance, light resistance, and chemical resistance.

Examples of the photopolymerizable compound may include ethylene glycol di(meth)acrylate, diethylene glycol di(meth)acrylate, triethylene glycol di(meth)acrylate, propylene glycol di(meth)acrylate, neopentyl glycol di(meth) acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth) acrylate, dipentaerythritol di(meth)acrylate, dipentaerythritol tri(meth)acrylate, dipentaerythritol penta (meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable compound may be as follows. Examples of the mono-functional ester of (meth)acrylic acid may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional ester of (meth)acrylic acid may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional ester of (meth)acrylic acid may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295 , V=300®, V-360®, V-GPT®, V-3PA®, NT-400® (Osaka Yuki Kayaku Kogyo Co. Ltd.), and the like. These may be used singularly or as a mixture of two or more.

In an implementation, the photopolymerizable compound may be treated with acid anhydride to improve developability.

In an implementation, the photopolymerizable compound may be included in the composition in an amount of about 1 wt % to about 15 wt %, e.g., about 5 wt % to about 10 wt %, based on the total weight of the photosensitive resin composition. When the photopolymerizable compound is included within the range, the photopolymerizable compound may be sufficiently cured during exposure in a pattern-forming process and may have excellent reliability, and developability for alkali developing solution may be improved.

(D) Photopolymerization Initiator

In an implementation, the photopolymerization initiator may include a suitable initiator for a photosensitive resin composition, e.g., an acetophenone-based compound, a benzophenone-based compound, a thioxanthone-based compound, a benzoin-based compound, a triazine-based compound, an oxime-based compound, or a combination thereof.

Examples of the acetophenone-based compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may include benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may include benzoin, benzoin methyl ether, benzoin ethyl ether, benzoin isopropyl ether, benzoin isobutyl ether, benzyldimethyl ketal, and the like.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphthol-1-yl)-4,6-bis(trichloromethyl)-s-triazine, 2-(4-methoxynaphthol-1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may include an O-acyloxime-based compound such as 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl] ethanone, O-ethoxycarbonyl-α-oxyamino-1-phenylpropan-1-one and the like. Specific examples of the O-acyloxime-based compound may be 1,2-octandione, 2-dimethylamino-2-(4-methylbenzyl)-1-(4-morpholin-4-yl-phenye-butan-1-one, 1-(4-phenylsulfanyl phenyl)-butane-1,2-dione 2-oxime-O-benzoate, 1-(4-phenylsulfanyl phenyl)-octane-1,2-dione-2-oxime-O-benzoate, 1-(4-phenylsulfanyl phenyl)-octan-1-one oxime-O-acetate and 1-(4- phenylsulfanyl phenyl)-butan-1-one oxime-O-acetate, and the like.

In an implementation, the photopolymerization initiator may further include, e.g., a carbazole-based compound, a diketone-based compound, a sulfonium borate-based compound, a diazo-based compound, an imidazole-based compound, a biimidazole-based compound, and the like.

In an implementation, the photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

In an implementation, the photopolymerization initiator be included in the composition in an amount of about 0.01 wt % to about 10 wt %, e.g., about 0.05 wt % to about 5 wt %, based on the total weight of photosensitive resin composition. When the photopolymerization initiator is included within the range, excellent reliability may be secured due to sufficiently curing during exposure in a pattern-forming process, a pattern may have excellent resolution and close-contacting properties as well as excellent heat resistance, light resistance, and chemical resistance, and transmittance may be prevented from deterioration due to a non-reaction initiator.

(E) Solvent

The solvent may have compatibility with the dye, the pigment, the binder resin, the photopolymerizable compound, and the photopolymerization initiator, but not reacting therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like. In an implementation, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl malete, γ-butyrolactone, ethylene carbonate, propylene carbonate, phenyl cellosolve acetate, and the like may be also used.

With a view toward miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates Qiioh as propylene glycol monomethylether acetate, propylene glycol propylether acetate, and the like may be used.

In an implementation, the solvent may be included in a balance amount, e.g., an amount such that a total amount of the composition adds up to 100 wt % when including all expressly described and any additional components. In an implementation, the solvent may be included in an amount of, e.g., about 30 wt % to about 90 wt %, about 30 wt % to about 80 wt %, or about 30 wt % to about 70 wt %, based on the total weight of the photosensitive resin composition. When the solvent is included within the range, the photosensitive resin composition may have an appropriate viscosity resulting in improvement of coating characteristics of a color filter.

(F) Other Additives

In an implementation, the photosensitive resin composition may further include an additive, e.g., an epoxy compound, malonic acid, 3-amino-1,2-propanediol, a silane-based coupling agent, a leveling agent, a surfactant, a radical polymerization initiator, or a combination thereof.

In an implementation, the photosensitive resin composition may further include an epoxy compound in order to help improve a close contacting property with a substrate.

Examples of the epoxy compound may include a phenol novolac epoxy compound, a tetramethyl biphenyl epoxy compound, a bisphenol A epoxy compound, an alicyclic epoxy compound, or a combination thereof.

In an implementation, the epoxy compound may be included in the composition in an amount of about 0.01 parts by weight to about 20 parts by weight, e.g., about 0.1 parts by weight to about 10 parts by weight, based on 100 parts by weight of the photosensitive resin composition. When the epoxy compound is included within the range, close contacting properties, storage capability, and the like may be improved.

In an implementation, the photosensitive resin composition may further include a silane coupling agent having a reactive substituent such as a carboxyl group, a methacryloyl group, an isocyanate group, an epoxy group, and the like, in order to help improve adherence to a substrate.

Examples of the silane coupling agent may include trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like. These may be used singularly or in a mixture of two or more.

In an implementation, the silane coupling agent may be included in the composition in an amount of about 0.01 parts by weight to about 10 parts by weight, based on 100 parts by weight of the photosensitive resin composition. When the silane coupling agent is included within the above range, close contacting properties, storage properties, and the like may be improved.

In an implementation, the photosensitive resin composition may further include a surfactant in order to help improve coating properties and inhibit generation of spots.

Examples of the surfactant may include a fluorene-based surfactant, e.g., BM-1000®, and BM-1100® (BM Chemie Inc.); MEGAFACE F 142D®, F 172®, F 173®, and F 183® Dainippon Ink Kagaku Kogyo Co., Ltd.); FULORAD FC-135 , FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (ASAHI Glass Co., Ltd.); and SH-28PA®, SH-190®, SH-193®, SZ-6032®, and SF-8428®, and the like (Toray Silicone Co., Ltd.).

In an implementation, the surfactant may be included in the composition in an amount of about 0.001 parts by weight to about 5 parts by weight, based on 100 parts by weight of the photosensitive resin composition. When the surfactant is included within the range, coating uniformity may be ensured, stains may not be generated, and wetting properties for a glass substrate may be improved.

In an implementation, the photosensitive resin composition may further other additives, e.g., an antioxidant, a stabilizer, and the like in a suitable amount when they reduce properties.

In an implementation, the photosensitive resin composition may be a negative photosensitive resin composition.

In an implementation, a color filter or photosensitive resin film manufactured using the photosensitive resin composition according to the embodiment may be provided.

In an implementation, a color filter including the photosensitive resin film may be provided.

A pattern-forming process in the color filter may be as follows.

The process may include coating the positive photosensitive resin composition on a support substrate in a method of spin coating, slit coating, inkjet printing, or the like; drying the coated positive photosensitive resin composition to form a photosensitive resin composition film; exposing the positive photosensitive resin composition film to light;

developing the exposed positive photosensitive resin composition film in an alkali aqueous solution to obtain a photosensitive resin film; and heat-treating the photosensitive resin film.

EXAMPLES

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

(Synthesis of Dye)

Synthesis Example 1

Synthesis of Dye Represented by Chemical Formula 7-17-1

A compound represented by Chemical Formula 1-2 (1.03 g, 2.1 mmol) and a compound represented by Chemical Formula 2-2 (0.71 g, 2.1 mmol) were put in a round-bottomed flask under a nitrogen atmosphere, toluene (5 g) and POCl₃ (1.29 g, 8.4 mmol) were added thereto, and the mixture was stirred for 5 hours while slowly heated up to 110° C. When the reaction was complete, the resultant was cooled down to ambient temperature, extracted with methyl ethyl ketone (MEK), and then, respectively cleaned with 10% NaCl, water, and 10% HCl. After removing an organic layer, the residue was dried, lithium bis(trifuloromethane)sulfonimide (1.2 g, 4.2 mmol) was added thereto, DMSO (10 g) was added thereto, and the mixture was stirred at ambient temperature for 30 minutes (an anion exchange process). The stirred reactant was dropped into water to produce a precipitate, and the precipitate was separated through a filter. The obtained solid compound was dissolved in acetonitrile (40 g), activated carbon (3 g) was added thereto, and the mixture was stirred for 30 minutes. The activated carbon was removed through a filter, and the filtered solution was distilled and then, dried to obtain a compound represented by Chemical Formula 7-17-1 (1.90 g, 83%).

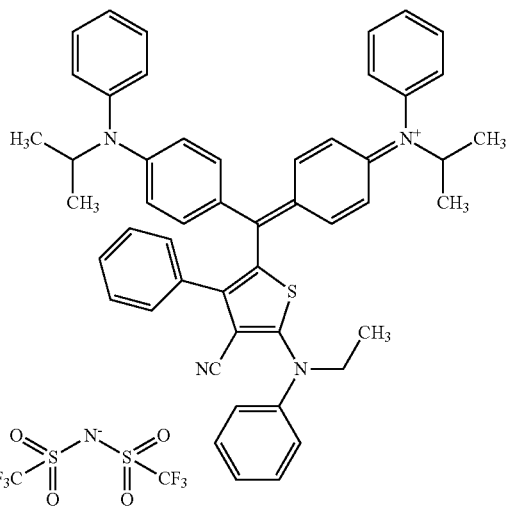

[Chemical Formula 7-17-1]

¹H NMR (solvent: CDCl₃) 7.51-7.38 (m, 12H), 7.20-7.03 (m, 12H), 6.42 (d, 4H), 4.52-4.45 (m, 2H), 4.08 (q, 2H), 1.38 (t, 3H), 1.17 (d, 12H)

Synthesis Example 2

Synthesis of Dye Represented by Chemical Formula 7-14-1

A dye represented by Chemical Formula 7-14-1 was synthesized according to the same method as Synthesis Example 1 except for using a compound represented by Chemical Formula 1-1 and a compound represented by Chemical Formula 2-1 instead of the compound represented by Chemical Formula 1-2 and the compound represented by Chemical Formula 2-2 as the starting materials.

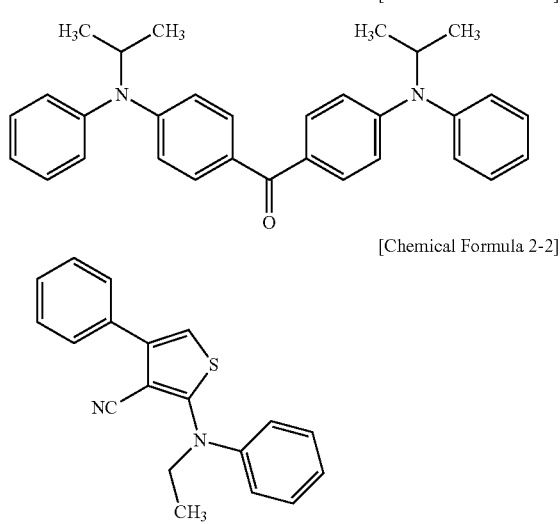

[Chemical Formula 1-2]

[Chemical Formula 2-2]

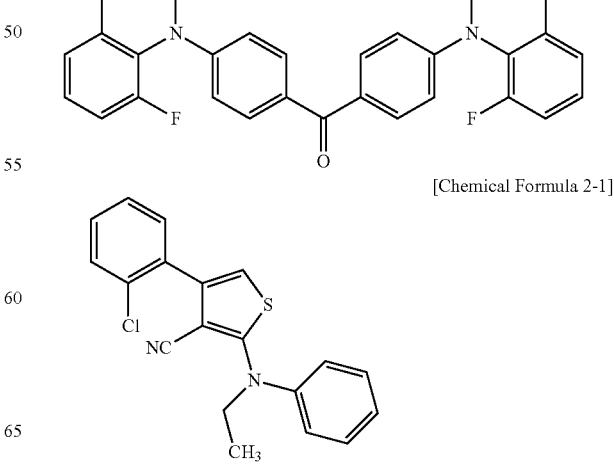

[Chemical Formula 1-1]

[Chemical Formula 2-1]

-continued

[Chemical Formula 7-14-1]

$^1$H NMR (solvent: CDCl$_3$) 7.57-7.51 (m, 3H), 7.45-7.26 (m, 8H), 7.10-7.05 (m, 9H), 6.50 (bs, 4H), 4.13 (q, 2H), 3.75 (q, 4H ), 1.41 (t, 3H), 1.24 (t, 6H)

(Preparation of Photosensitive Resin Composition)

Example 1

Each photosensitive resin composition according to Examples 1 to 3 and Comparative Examples 1 to 4 was prepared to have a composition shown in Table 1. Specifically, a photopolymerization initiator was dissolved in a solvent, and the solution was stirred at ambient temperature for 2 hours. Then, a binder resin and a photopolymerizable monomer were added thereto, and the mixture was stirred at ambient temperature for 2 hours. Subsequently, a dye (a pigment dispersion liquid depending on a case) was added thereto, the mixture was stirred at ambient temperature for one hour, other additives (a surfactant) were added thereto, and the obtained mixture was stirred at ambient temperature for one hour. The solution was filtered three times to remove impurities to prepare a photosensitive resin composition.

(A) Binder Resin
Acryl-based binder resin (methacrylic acid/benzyl methacrylate=15/85 (w/w), weight average molecular weight=22,000 g/mol, acid value=100 mgKOH/g)
(B) Dye
(B-1) Dye represented by Chemical Formula 7-17-1
(B-2) Dye represented by Chemical Formula 7-14-1
(B-3) Dye represented by Chemical Formula 18 (Winchemical Ltd., Brilliant Blue FG)

[Chemical Formula 18]

(B') Pigment
(B'-1) B 15:6 pigment dispersion liquid (Sanyo Ltd.)
(C) Photopolymerizable Compound
Dipentaerythritolhexaacrylate (DPHA)
(D) Photopolymerization Initiator
Oxime-based initiator (OXE-01, BASF Corp.)
(E) Solvent
Propylene glycol monomethyl ether acetate (PGMEA)
(F) Other Additives
Fluorine-based surfactant (F-554 (a 10% diluted solution), DIC Co., Ltd.)
Evaluation
Evaluation 1: Luminance and Heat Resistance
The photosensitive resin compositions according to Examples 1 to 3 and Comparative Examples 1 to 4 were respectively applied at an rpm suitable for obtaining a predetermined thickness by using a coater (Opticoat MS-A150, Mikasa Co., Ltd.) and pre-baked on a 90° C.

TABLE 1

(unit: wt %)

| | | Example 1 | Example 2 | Example 3 | Comparative Example 1 | Comparative Example 2 | Comparative Example 3 | Comparative Example 4 |
|---|---|---|---|---|---|---|---|---|
| (A) binder resin | | 10 | 10 | 10 | 10 | 10 | 10 | 10 |
| (C) photopolymerizable compound | | 6.5 | 6.5 | 6.5 | 6.5 | 6.5 | 6.5 | 6.5 |
| (D) photopolymerization initiator | | 0.4 | 0.4 | 0.4 | 0.4 | 0.4 | 0.4 | 0.4 |
| (B) colorant | (B-1) dye | 33 | — | 20 | — | — | 5 | 45 |
| | (B-2) dye | — | 33 | — | — | — | — | — |
| | (B-3) dye | — | — | — | 33 | — | — | — |
| | (B'-1) pigment | — | — | — | — | 33 | — | — |
| (E) solvent | | 49.8 | 49.8 | 62.8 | 49.8 | 49.8 | 72.8 | 37.8 |
| (F) other additive | | 0.3 | 0.3 | 0.3 | 0.3 | 0.3 | 0.3 | 0.3 |
| Total | | 100.0 | 100.0 | 100.0 | 100.0 | 100.0 | 100.0 | 100.0 | hot-plate (before PSB). Subsequently, thin film specimens were completed by exposing the coated compositions with an exposer (HB-50110AA, Ushio Inc.) under an exposure condition of 50 mJ/cm² and baked at 230° C. in an oven for 30 minutes (after PSB). Before and after the oven-baking, a color coordinate and luminance (Y) of the thin film specimens were measured by using a MCPD 3000 equipment, and the results are shown in Table 2. In addition, del (E*) was calculated with a reference to color coordinate changes before and after the PSB to evaluate heat resistance, and the results are shown in Table 3.

Evaluation 2: Light Resistance and Chemical Resistance

Light resistance was evaluated by exposing the thin film specimens in Evaluation 1 with an xenon lamp (0.68 W of intensity) at 60° C. for 2 hours, measuring its color coordinate by using an MCPD 3000 equipment, converting the color coordinate into del (E*) with a reference to a change of the color coordinate before and after the PSB, and the results are shown in Table 3.

Evaluation 3: Chemical Resistance

Chemical characteristics were measured by dipping the thin film specimens of Evaluation 1 in N-methylpyrrolidone (NMP) at ambient temperature for 10 minutes and drying them. Subsequently, chemical resistances were measured by measuring the color coordinate of the thin film specimens with an MCPD 3000 equipment and converting the color coordinate into del (E*) with a reference to changes of the color coordinate before and after the PSB, and the results are shown in Table 3.

TABLE 2

|  | Step | Y |
| --- | --- | --- |
| Example 1 | Before PSB | 12.12 |
|  | After PSB | 12.07 |
| Example 2 | Before PSB | 12.25 |
|  | After PSB | 12.18 |
| Example 3 | Before PSB | 12.11 |
|  | After PSB | 12.02 |
| Comparative Example 1 | Before PSB | 10.85 |
|  | After PSB | 10.36 |
| Comparative Example 2 | Before PSB | 11.31 |
|  | After PSB | 10.22 |
| Comparative Example 3 | Before PSB | 11.74 |
|  | After PSB | 11.20 |
| Comparative Example 4 | Before PSB | 10.23 |
|  | After PSB | 9.98 |

TABLE 3

|  | Heat resistance | Light resistance | Chemical resistance |
| --- | --- | --- | --- |
| Example 1 | 1.72 | 1.87 | 2.73 |
| Example 2 | 1.31 | 1.7 | 2.87 |
| Example 3 | 1.45 | 1.83 | 2.78 |
| Comparative Example 1 | 2.35 | 0.67 | 2.89 |
| Comparative Example 2 | 4.01 | 11.37 | 20.68 |
| Comparative Example 3 | 1.76 | 1.90 | 2.94 |
| Comparative Example 4 | 1.99 | 1.92 | 2.98 |

Referring to Tables 2 and 3, the photosensitive resin compositions according to Examples 1 to 3 showed excellent luminance, heat resistance, and chemical resistance and simultaneously, excellent light resistance characteristics, compared with the photosensitive resin compositions according to Comparative Examples 1 to 4.

By way of summation and review, a pigment has a limit in terms of luminance and a contrast ratio due to a particle size. A color image sensor for an image sensor may require a much smaller dispersion particle diameter. Luminance, contrast ratio, and the like may be improved by using the pigment not alone but a mixture with a dye as a hybrid colorant.

The hybrid colorant may not show an excellent effect on improving properties such as heat resistance and luminance, compared with other colorants.

An appropriate compound may be used as a colorant used for a photosensitive resin composition.

The photosensitive resin composition according to an embodiment may include a dye within a predetermined amount range and thus may provide a color filter having excellent luminance, heat resistance, and chemical resistance and light resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photosensitive resin composition, comprising
a binder resin;
a dye consisting of a cation and an anion;
a photopolymerizable compound;
a photopolymerization initiator, and
a solvent,
wherein the dye is included in an amount of about 15 wt % to about 40 wt % based on a total weight of a photosensitive resin composition,
wherein the cation is represented by Chemical Formula 1:

[Chemical Formula 1]

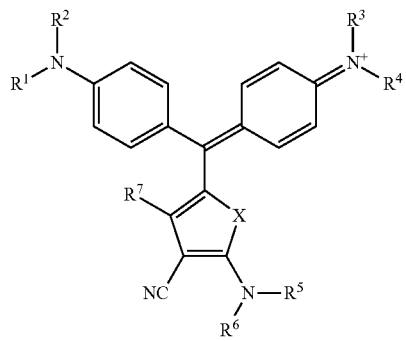

wherein, in Chemical Formula 1,
$R^1$ to $R^6$ are each independently a hydrogen atom, a substituted or unsubstituted C1 to C20 alkyl group, a substituted or unsubstituted C6 to C20 aryl group, or a substituted or unsubstituted C2 to C20 heteroaryl group,
$R^7$ is a substituted or unsubstituted C6 to C20 aryl group, and
X is —O—, —S—, or —$NR^8$—, in which $R^8$ is a hydrogen atom, a substituted or unsubstituted C1 to C10 alkyl group or a substituted or unsubstituted C6 to C20 aryl group.

2. The photosensitive resin composition as claimed in claim 1, wherein X is —O— or —S—.

3. The photosensitive resin composition as claimed in claim 1, wherein $R^1$ to $R^4$ are each independently a substituted or unsubstituted C1 to C20 alkyl group or a substituted or unsubstituted C6 to C20 aryl group.

4. The photosensitive resin composition as claimed in claim 1, wherein the cation represented by Chemical Formula 1 is represented by Chemical Formula 2:

[Chemical Formula 2]

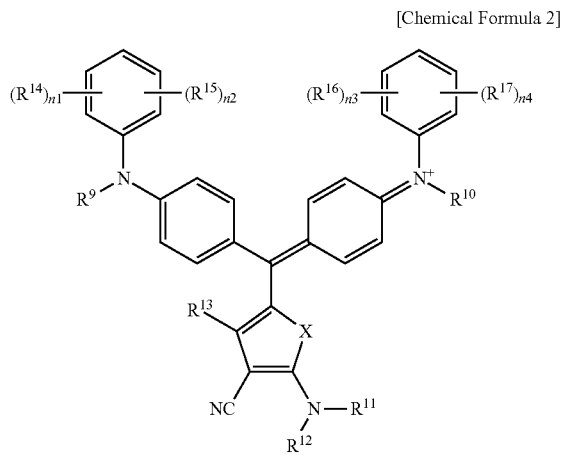

wherein, in Chemical Formula 2,
$R^9$ and $R^{10}$ are each independently a substituted or unsubstituted C1 to C20 alkyl group,
$R^{11}$ and $R^{12}$ are each independently a hydrogen atom, a substituted or unsubstituted C1 to C20 alkyl group, or a substituted or unsubstituted C6 to C20 aryl group,
$R^{13}$ is a substituted or unsubstituted C6 to C20 aryl group,
$R^{14}$ to $R^{17}$ are each independently a halogen atom or a substituted or unsubstituted C1 to C 10 alkyl group,
n1 to n4 are each independently an integer of 0 to 5, such that 0≤n1+n2≤5, and 0≤n3+n4≤5, and
X is —O— or —S—.

5. The photosensitive resin composition as claimed in claim 1, wherein the cation represented by Formula 1 is represented by one of the following Chemical Formula 3 to Chemical Formula 7:

[Chemical Formula 3]

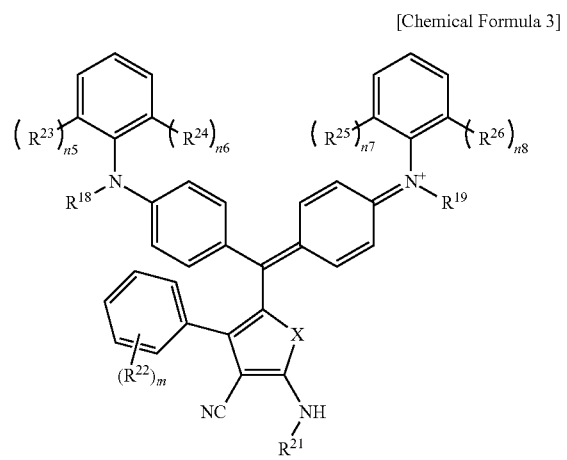

wherein, in Chemical Formula 3,
$R^{18}$, $R^{19}$, and $R^{21}$ are each independently a substituted or unsubstituted C1 to C20 alkyl group,
$R^{22}$ is a halogen atom,
$R^{23}$ to $R^{26}$ are each independently a halogen atom or a substituted or unsubstituted C1 to C 10 alkyl group,
m is an integer of 0 to 2,
n5 to n8 are each independently 0 or 1, and
X is —O— or —S—,

[Chemical Formula 4]

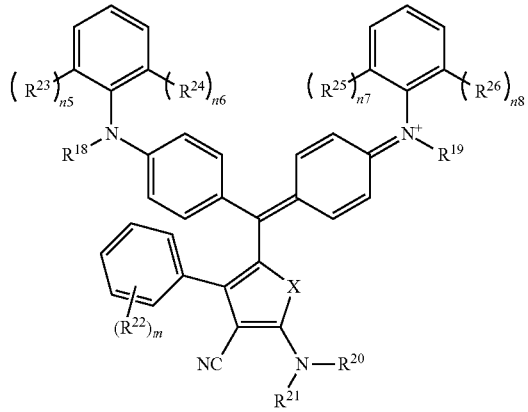

wherein, in Chemical Formula 4,
$R^{18}$ to $R^{21}$ are each independently a substituted or unsubstituted C1 to C20 alkyl group,
$R^{22}$ is a halogen atom,
$R^{23}$ to $R^{26}$ are each independently a halogen atom or a substituted or unsubstituted C1 to C10 alkyl group,
m is an integer of 0 to 2,
n5 to n8 are each independently 0 or 1, and
X is —O— or —S—,

[Chemical Formula 5]

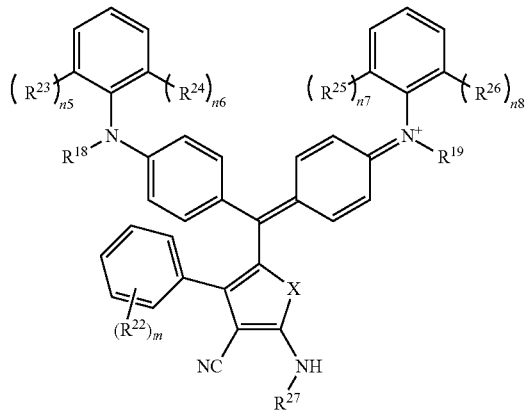

wherein, in Chemical Formula 5,
$R^{18}$ and $R^{19}$ are each independently a substituted or unsubstituted C1 to C20 alkyl group,
$R^{22}$ is a halogen atom,
$R^{23}$ to $R^{26}$ are each independently a halogen atom or a substituted or unsubstituted C1 to C10 alkyl group,
$R^{27}$ is a substituted or unsubstituted C6 to C20 aryl group,
m is an integer of 0 to 2,
n5 to n8 are each independently 0 or 1, and
X is —O— or —S—,

[Chemical Formula 6]

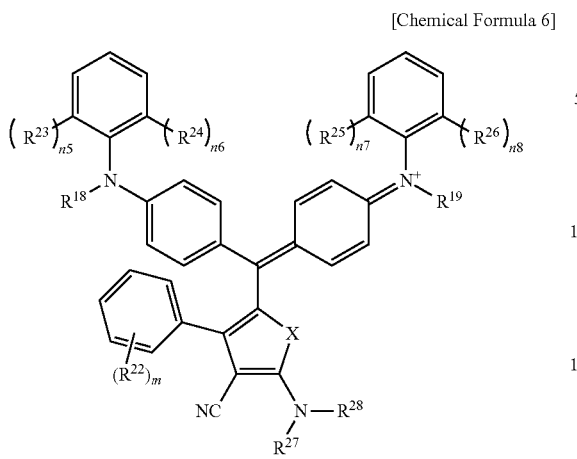

wherein, in Chemical Formula 6, $R^{18}$ and $R^{19}$ are each independently a substituted or unsubstituted C1 to C20 alkyl group, $R^{22}$ is a halogen atom, $R^{23}$ to $R^{26}$ are each independently a halogen atom or a substituted or unsubstituted C1 to C10 alkyl group, $R^{27}$ and $R^{28}$ are each independently a substituted or unsubstituted C6 to C20 aryl group, m is an integer of 0 to 2, n5 to n8 are each independently 0 or 1, and X is —O— or —S—,

[Chemical Formula 7]

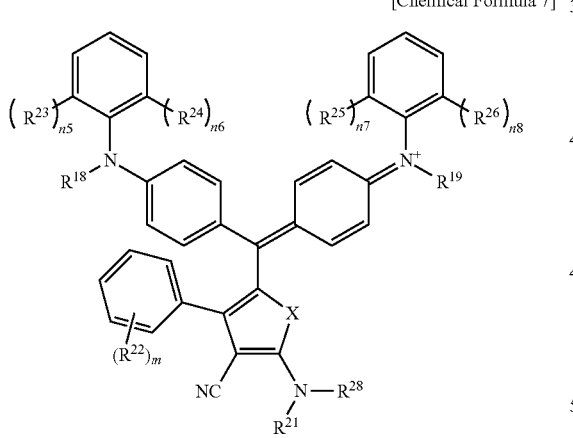

wherein, in Chemical Formula 7, $R^{18}$, $R^{19}$, and $R^{21}$ are each independently a substituted or unsubstituted C1 to C20 alkyl group, $R^{22}$ is a halogen atom, $R^{23}$ to $R^{26}$ are each independently a halogen atom or a substituted or unsubstituted C1 to C10 alkyl group, $R^{28}$ is a substituted or unsubstituted C6 to C20 aryl group, m is an integer of 0 to 2, n5 to n8 are each independently 0 or 1, and X is —O— or —S—.

6. The photosensitive resin composition as claimed in claim 1, wherein the cation represented by Chemical Formula 1 is represented one of the following Chemical Formula 5-3, Chemical Formula 5-4, Chemical Formula 5-5, Chemical Formula 5-6, Chemical Formula 7-6, Chemical Formula 7-8, Chemical Formula 7-10, Chemical Formula 7-12, Chemical Formula 7-14, and Chemical Formula 7-17:

[Chemical Formula 5-3]

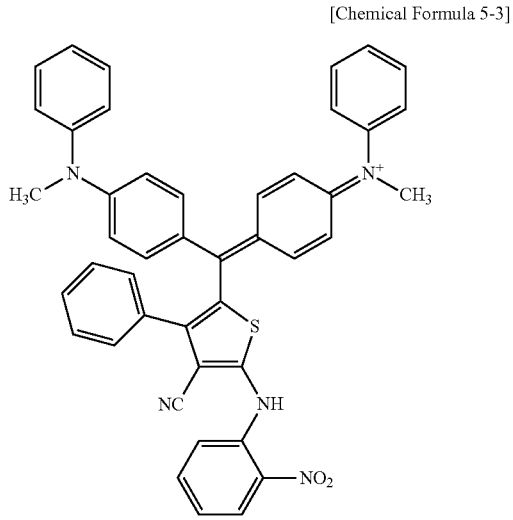

[Chemical Formula 5-4]

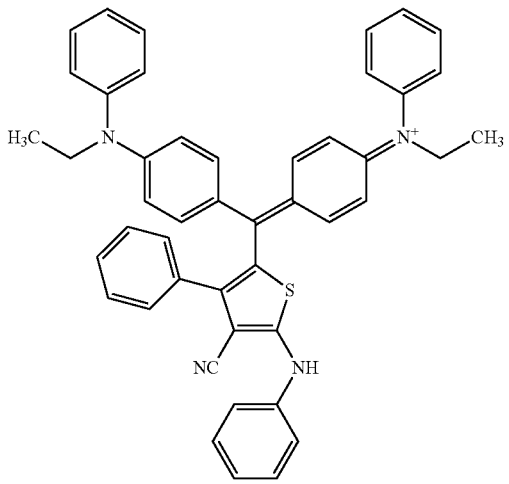

[Chemical Formula 5-5]

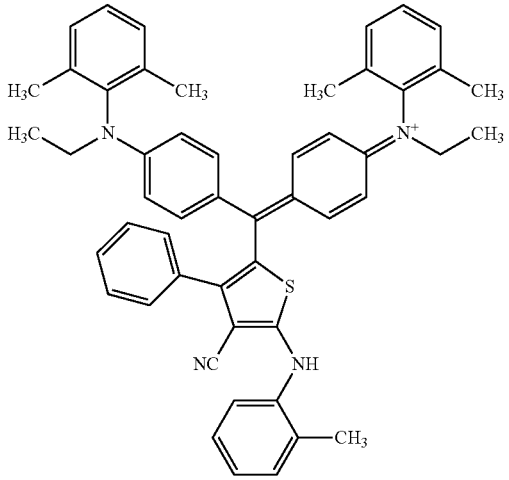

-continued
[Chemical Formula 5-6]
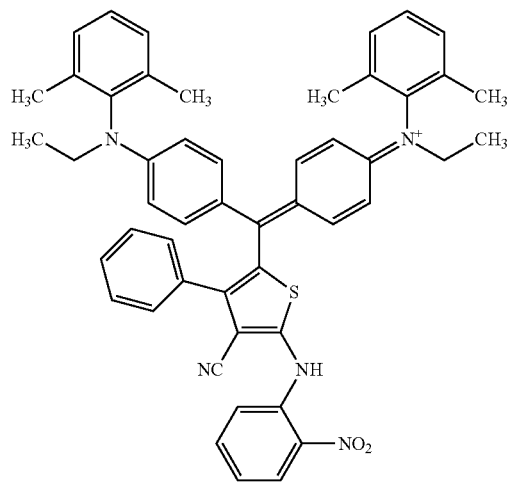
[Chemical Formula 7-6]
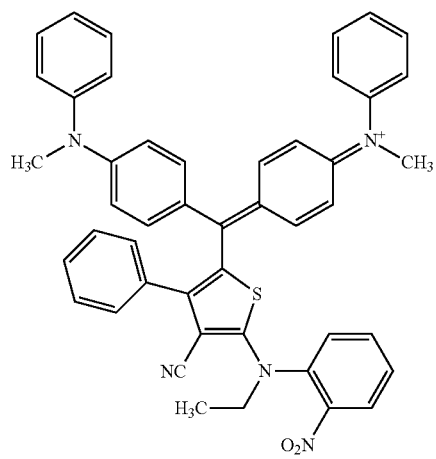
-continued
[Chemical Formula 7-10]
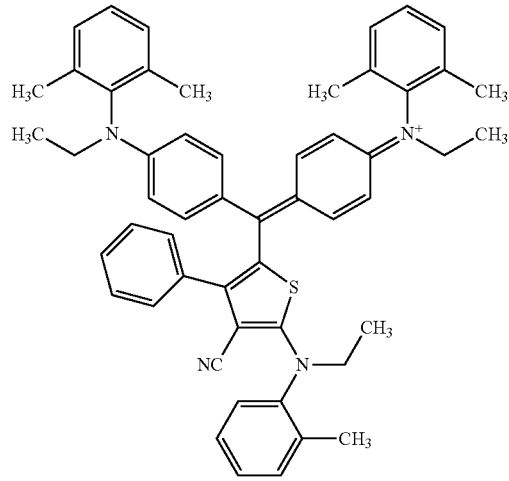
[Chemical Formula 7-12]
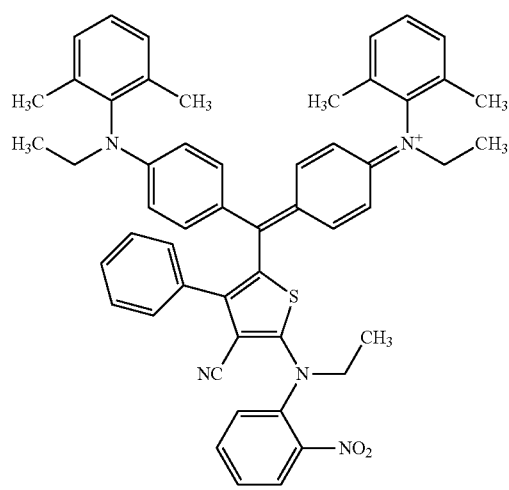
[Chemical Formula 7-8]
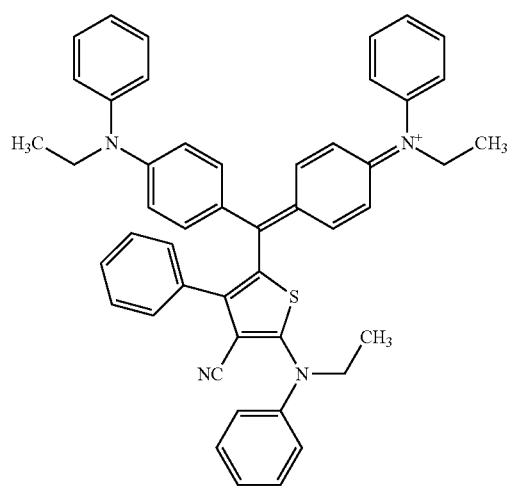
[Chemical Formula 7-14]
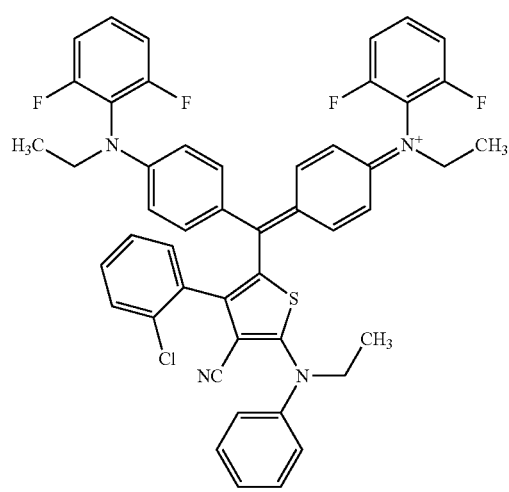

-continued

[Chemical Formula 7-17]

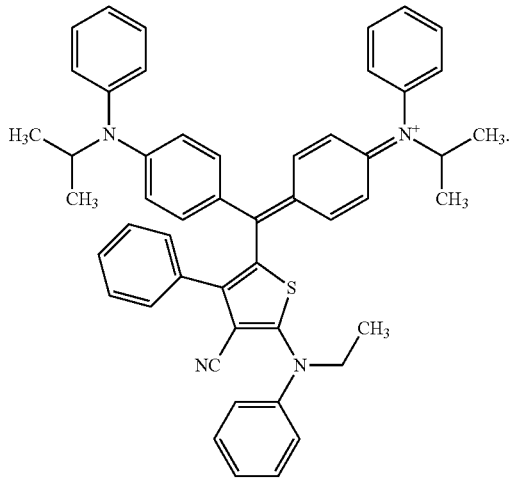

7. The photosensitive resin composition as claimed in claim 1, wherein the anion is represented by one of the following Chemical Formula A to Chemical Formula F:

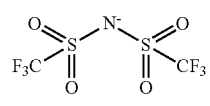
[Chemical Formula A]

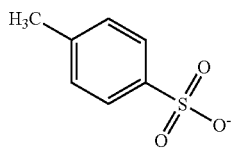
[Chemical Formula B]

$PW_{12}O_{40}^{3-}$ [Chemical Formula C]

$SiW_{12}O_{40}^{4-}$ [Chemical Formula D]

$CF_3SO_3^-$ [Chemical Formula E]

$ClO_4^-$. [Chemical Formula F]

8. The photosensitive resin composition as claimed in claim 1, wherein the dye is a blue dye.

9. The photosensitive resin composition as claimed in claim 1, wherein the dye has a maximum absorbance ($\lambda_{max}$) in a wavelength of about 600 nm to about 700 nm.

10. The photosensitive resin composition as claimed in claim 1, wherein the dye has a maximum transmittance ($T_{max}$) in a wavelength of about 400 nm to about 500 nm.

11. The photosensitive resin composition as claimed in claim 1, further comprising a pigment.

12. The photosensitive resin composition as claimed in claim 1, wherein the binder resin has an a weight average molecular weight of about 5,000 g/mol to about 15,000 g/mol.

13. The photosensitive resin composition as claimed in claim 1, wherein the binder resin has an acid value of about 80 mgKOH/g to about 130 mgKOH/g.

14. The photosensitive resin composition as claimed in claim 1, wherein the binder resin includes an acryl-based binder resin, a cardo-based binder resin, or a combination thereof.

15. The photosensitive resin composition as claimed in claim 1, wherein the photosensitive resin composition includes:
    about 1 wt % to about 30 wt % of the binder resin;
    the about 15 wt % to about 40 wt % of the dye;
    about 1 wt % to about 15 wt % of the photopolymerizable compound;
    about 0.01 wt % to about 10 wt % of the photopolymerization initiator, and
    a balance amount of the solvent,
    all wt % being based on the total weight of the photosensitive resin composition.

16. The photosensitive resin composition as claimed in claim 1, further comprising an epoxy compound, malonic acid, 3-amino-1,2-propanediol, a silane-based coupling agent, a leveling agent, a surfactant, a radical polymerization initiator, or a combination thereof.

17. A photosensitive resin film manufactured using the photosensitive resin composition as claimed in claim 1.

18. A color filter including the photosensitive resin film as claimed in claim 17.

* * * * *